United States Patent
Suzuki et al.

(10) Patent No.: US 9,817,410 B2
(45) Date of Patent: Nov. 14, 2017

(54) AIR CONDITIONER TESTING SYSTEM, AIR-CONDITIONING SYSTEM SIMULATOR, AND PROGRAM

(75) Inventors: Shigeki Suzuki, Tokyo (JP); Noriyuki Kushiro, Tokyo (JP); Shinji Nakamura, Tokyo (JP); Yoshiaki Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 562 days.

(21) Appl. No.: 14/388,073

(22) PCT Filed: Mar. 30, 2012

(86) PCT No.: PCT/JP2012/058633
§ 371 (c)(1),
(2), (4) Date: Sep. 25, 2014

(87) PCT Pub. No.: WO2013/145270
PCT Pub. Date: Oct. 3, 2013

(65) Prior Publication Data
US 2015/0148966 A1 May 28, 2015

(51) Int. Cl.
*G01M 1/38* (2006.01)
*G05D 23/19* (2006.01)
(Continued)

(52) U.S. Cl.
CPC ...... *G05D 23/1917* (2013.01); *F24F 11/0009* (2013.01); *F24F 11/02* (2013.01);
(Continued)

(58) Field of Classification Search
None
See application file for complete search history.

(56) References Cited

U.S. PATENT DOCUMENTS 3,785,064 A * 1/1974 Thomas, Jr. ........... G09B 25/02
434/219
5,299,432 A * 4/1994 Nakae ...................... F24F 11/00
62/298
(Continued)

FOREIGN PATENT DOCUMENTS

JP 07-121405 A 5/1995
JP 10-161906 A 6/1998
(Continued)

OTHER PUBLICATIONS

International Search Report of the International Searching Authority dated Jun. 19, 2012 for the corresponding international application No. PCT/JP2012/058633 (with English translation).
(Continued)

*Primary Examiner* — Adam Lee
(74) *Attorney, Agent, or Firm* — Posz Law Group, PLC

(57) ABSTRACT

A test device simulator simulates the behavior of a test device to be tested on the basis of content indicating an input operation by a user, data transmitted from an air-conditioning system simulator, and device object data stored in a data storage. In the case in which the simulation generates data to transmit to the air-conditioning system simulator, the test device simulator transmits that data to the air-conditioning system simulator. The air-conditioning system simulator includes multiple simulation process sections. Each simulation process section, on the basis of content indicated by the input operation performed by the user on the device simulated by the simulation process section itself, data addressed to that device transmitted from the test device simulator, and the device object data stored in the data storage and corresponding to that device, simulates the behavior of that device.

9 Claims, 20 Drawing Sheets

(51) Int. Cl.
*F24F 11/02* (2006.01)
*F24F 11/00* (2006.01)
*G06F 17/50* (2006.01)

(52) U.S. Cl.
CPC .. *G06F 17/5009* (2013.01); *F24F 2011/0057* (2013.01); *F24F 2011/0063* (2013.01)

(56) References Cited

U.S. PATENT DOCUMENTS

| | | | | |
|---|---|---|---|---|
| 5,816,059 | A * | 10/1998 | Ficchi, Jr. | G05B 19/048 236/94 |
| 6,134,511 | A * | 10/2000 | Subbarao | G06F 17/5004 703/1 |
| 6,283,380 | B1 * | 9/2001 | Nakanishi | F24F 11/053 236/49.3 |
| 2003/0060933 | A1 * | 3/2003 | Sulfstede | G05B 23/0235 700/276 |
| 2003/0070438 | A1 * | 4/2003 | Kikuchi | F24F 11/006 62/141 |
| 2004/0011066 | A1 * | 1/2004 | Sugihara | F24F 11/006 62/177 |
| 2004/0260490 | A1 * | 12/2004 | Matsubayashi | H02J 13/0062 702/60 |
| 2006/0004492 | A1 * | 1/2006 | Terlson | F24F 11/0086 700/276 |
| 2006/0259285 | A1 * | 11/2006 | Bahel | G06F 17/5009 703/7 |
| 2006/0282248 | A1 | 12/2006 | Kageyama et al. | |
| 2007/0227168 | A1 * | 10/2007 | Simmons | F24F 1/027 62/229 |
| 2008/0221708 | A1 * | 9/2008 | Oyama | G06F 13/24 700/9 |
| 2010/0114385 | A1 * | 5/2010 | Dempster | G05B 15/02 700/276 |
| 2011/0015916 | A1 | 1/2011 | Kataoka et al. | |
| 2012/0101791 | A1 * | 4/2012 | Komatsu | G05B 17/02 703/6 |
| 2012/0253527 | A1 * | 10/2012 | Hietala | G05B 17/02 700/278 |
| 2012/0296478 | A1 * | 11/2012 | Ogura | F24F 11/0086 700/276 |
| 2012/0305661 | A1 * | 12/2012 | Malchiondo | F24F 11/0012 236/44 A |
| 2013/0151220 | A1 * | 6/2013 | Matsumura | G06F 17/5009 703/7 |

FOREIGN PATENT DOCUMENTS

| | | |
|---|---|---|
| JP | 2004-038785 A | 2/2004 |
| JP | 2004-293844 A | 10/2004 |
| JP | 2006-350549 A | 12/2006 |
| JP | 2008-077560 A | 4/2008 |
| JP | 2010-157103 A | 7/2010 |
| JP | 4597716 B2 | 10/2010 |
| JP | 2011-022702 A | 2/2011 |

OTHER PUBLICATIONS

Office Action dated Apr. 14, 2015 in the corresponding JP application No. 2014-507231 (and English translation).

* cited by examiner

```
//  CASE OF NOT RECEIVING A RESPONSE
If ( address == 10) {
    switch (command) {
        case OPERATION REQUEST:   //IF OPERATION REQUEST IS RECEIVED,
        case ACQUISITION REQUEST: //OR IF ACQUISITION REQUEST IS RECEIVED,
            sendAck();             //TRANSMIT Ack
            // sendResponse();     //DO NOT TRANSMIT RESPONSE
    }
}
```

```
//  CASE OF REPEATEDLY RECEIVING A RESPONSE
If ( address == 10 ) {
  switch (command) {
    case OPERATION REQUEST: //IF OPERATION REQUEST IS RECEIVED,
    case ACQUISITION REQUEST: //OR IF ACQUISITION REQUEST IS RECEIVED,
      sendAck();          //TRANSMIT Ack
      sendResponse();     //TRANSMIT RESPONSE
      break;
    case Ack:             //IF Ack IS RECEIVED,
        sendResponse();   //TRANSMIT RESPONSE
        break;
  }
}
```

AIR CONDITIONER TESTING SYSTEM, AIR-CONDITIONING SYSTEM SIMULATOR, AND PROGRAM

CROSS REFERENCE TO RELATED APPLICATION

This application is a U.S. national stage application of International Application No. PCT/JP2012/058633 filed on Mar. 30, 2012, the disclosure of which is incorporated herein by reference.

TECHNICAL FIELD

The present disclosure relates to technology for testing an air-conditioning system.

BACKGROUND ART

In air-conditioning systems called multi-air-conditioners for buildings, respective devices such as an outdoor unit (outdoor device), an indoor unit (indoor device), individual remote controls, and a centralized remote control are connected by an air-conditioning network. In air-conditioning systems of this type, after completing testing of the individual devices (unit testing), system testing combining the respective devices (also called combined testing) is performed.

System testing requires hypothesizing the maximum scale of the air-conditioning system, regardless of the actual supplied scale. Consequently, it is necessary to construct an air-conditioning system for system testing in which approximately 250 devices are connected to a network, for example. For this reason, in the related art, for large-scale devices such as outdoor devices and indoor devices, system testing is performed by connecting only the control boards built into those devices to the network.

However, the above system testing of the related art has the following problems.

(1) Even without connecting the actual devices such as the air conditioner and indoor devices, it is still necessary to construct an air-conditioning system for system testing in which many control boards are connected to a network. For this reason, a large work space is required, and securing a testing location is not easy.

(2) The work of connecting each control board to the network is required, and in addition, work such as attaching resistors instead of sensors is required for each control board so that errors do not occur in the IT process with the various sensors provided in the outdoor devices and the indoor devices. In other words, constructing an air-conditioning system for system testing is extremely labor-intensive.

In contrast, Patent Literature 1 discloses technology that simulates the behavior of an air conditioner on a computer.

CITATION LIST

Patent Literature

Patent Literature 1: Japanese Patent No. 4597716

SUMMARY OF INVENTION

Technical Problem

The air conditioner simulator described in Patent Literature 1 includes an on-board simulation program that reuses microcomputer control programs of actual devices (real devices) such as the outdoor devices, indoor devices, and individual remote controls to be simulated. The simulation program is a conversion of actual microcomputer control programs for operation by an air conditioner simulator such as a personal computer. The air conditioner simulator simulates the behavior of the real devices by executing such a simulation program.

However, even though the above simulation program reuses actual microcomputer control programs, behavioral processes for the simulation that are not present in the original behavior of the real devices are also incorporated. Consequently, from the perspective of system testing, there are obstacles to treating a simulation by this air conditioner simulator as being equal to the behavior of real devices.

The present disclosure has been devised in light of the above circumstances, and takes as an object to provide an air conditioner testing system and the like enabling system testing to be performed without using real devices, by realizing a simulation that conforms to the behavior of real devices as much as possible.

Solution to Problem

In order to achieve the above object, an air conditioner testing system according to the present disclosure is provided with:

a test device simulator that simulates behavior of a test device to be tested that constitutes part of an air-conditioning system; and an air-conditioning system simulator that simulates behavior of a plurality of devices constituting the air-conditioning system;

wherein the test device simulator includes
 a first controller,
 a first operation receiver that receives an input operation from a user, and sends to the first controller a signal related to the received operation,
 a first data storage that stores device object data of the test device, and
 a first communicator that, under control by the first controller, accomplishes data communication with the air-conditioning system simulator via a first network, the first controller includes
 a first simulation process section that simulates behavior of the test device on the basis of content indicated by the input operation from the user, data transmitted from the air-conditioning system simulator, and the device object data stored in the first data storage, and
 a first data transmitter/receiver that supplies data transmitted from the air-conditioning system simulator to the first simulation process section, and in addition, in a case in which the first simulation process section generates data to transmit to the air-conditioning system simulator, supplies that data to the first communicator, the air-conditioning system simulator includes
 a second controller,
 a second operation receiver that receives an input operation from a user, and sends to the second controller a signal related to the received operation,
 a second data storage that stores device object data corresponding to each of the plurality of devices, and
 a second communicator that, under control by the second controller, accomplishes data communication with the test device simulator via the first network, the second controller includes a plurality of second simulation process sections and a plurality of second data transmitters/receivers, each second simulation process section, on the basis of content indicated by the input operation performed by the user on the device simulated by that second simulation process section itself, data addressed to that device transmitted from the test device simulator, and the device object data stored in the second data storage and corresponding to that device, simulates behavior of that device, and each second data transmitter/receiver supplies data transmitted from the test device simulator and addressed to the device corresponding to that second data transmitter/receiver itself to the corresponding second simulation process section, and in addition, in a case in which the corresponding second simulation process section generates data to transmit to the test device simulator, supplies that data to the second communicator.

Advantageous Effects of Invention

According to the present disclosure, it is possible to realize a simulation that conforms to the behavior of the real devices constituting an air-conditioning system as much as possible.

DESCRIPTION OF EMBODIMENTS

Hereinafter, exemplary embodiments of the present disclosure will be described in detail and with reference to the drawings.

(Embodiment 1)

Figure 1:
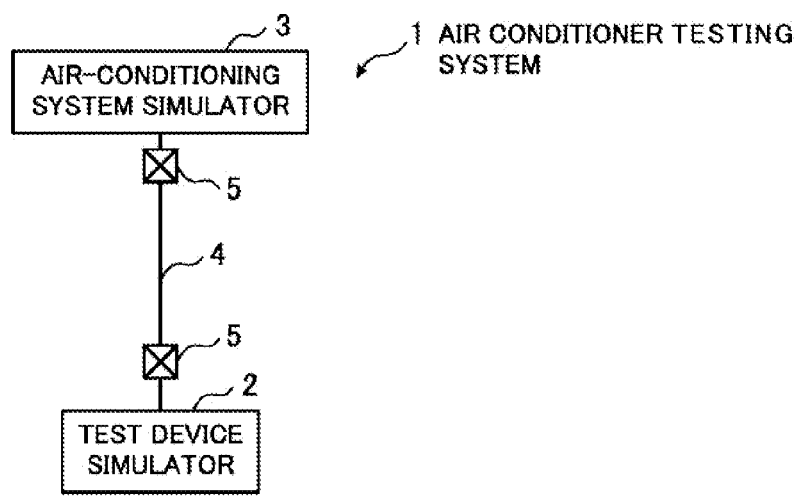
FIG. 1 is a diagram illustrating a configuration of an air conditioner testing system according to Embodiment 1 of the present disclosure.

FIG. 1 is a block diagram illustrating a configuration of an air conditioner testing system 1 according to Embodiment 1 of the present disclosure. This air conditioner testing system 1 is a system for performing simulated operational testing of an air-conditioning system made up of multiple air conditioners (real devices). The air conditioner testing system 1 is made up of a test device simulator 2 and an air-conditioning system simulator 3. The test device simulator 2 and the air-conditioning system simulator 3 are connected to an air-conditioning network 4 via respective protocol converters 5. The specifications of the air-conditioning network 4 are similar to a known network implemented in an actual air-conditioning system. Each protocol converter 5 is a device that conducts a communication protocol conversion to make data respectively transmitted from the test device simulator 2 and the air-conditioning system simulator 3 compatible with the air-conditioning network 4.

Figure 2:
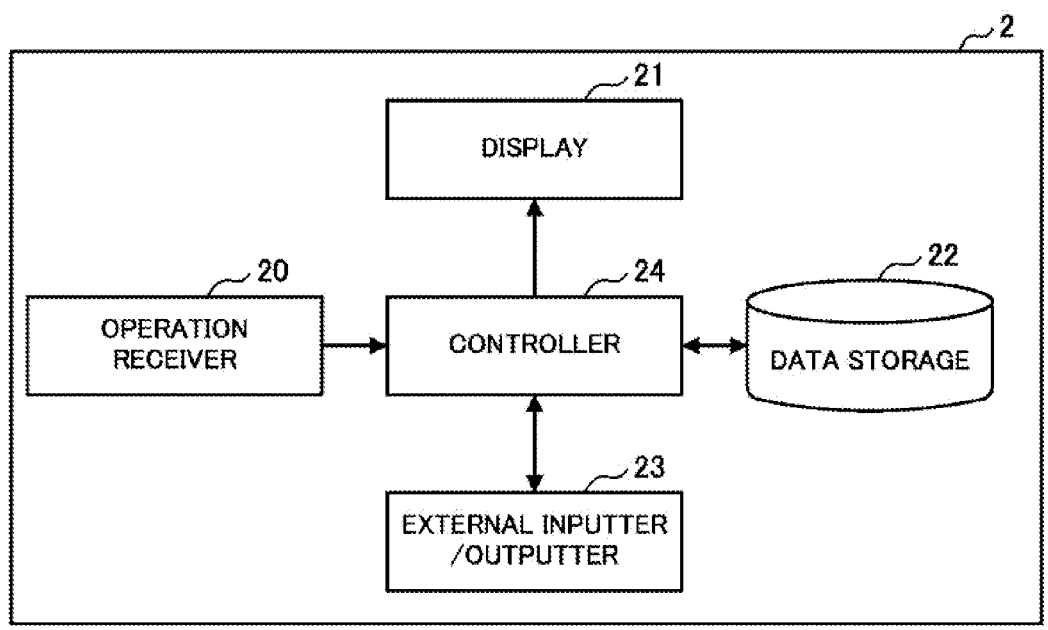
FIG. 2 is a block diagram illustrating a configuration of the test device simulator of Embodiment 1.

The test device simulator 2 is a device for simulating the behavior of a real device to be tested (a test device). As illustrated in FIG. 2, the test device simulator 2 comprises an operation receiver 20, a display 21, a data storage 22, an external inputter/outputter 23, and a controller 24. The operation receiver 20 includes a keyboard, mouse, keypad, touchpad, touch panel, or the like, for example, receives an input operation from a user, and sends to the controller 24 a signal related to the received input operation (an operation signal).

The display 21 includes a CRT or liquid crystal monitor, for example, and under control by the controller 24, displays screens for user operation, simulation results, and the like. The external inputter/outputter 23 includes a Universal Serial Bus (USB) port or the like, for example, outputs data to an external device (for example, the air-conditioning system simulator 3), and also inputs data from an external device.

The data storage 22 includes read-only memory (ROM), readable/writable non-volatile semiconductor memory, a hard disk drive, or the like, for example, and stores programs and various data (discussed in detail later) used by the test device simulator 2.

The controller 24 includes a central processing unit (CPU), and controls each of the above components. The functions of the controller 24 will be discussed in detail later.

Figure 3:
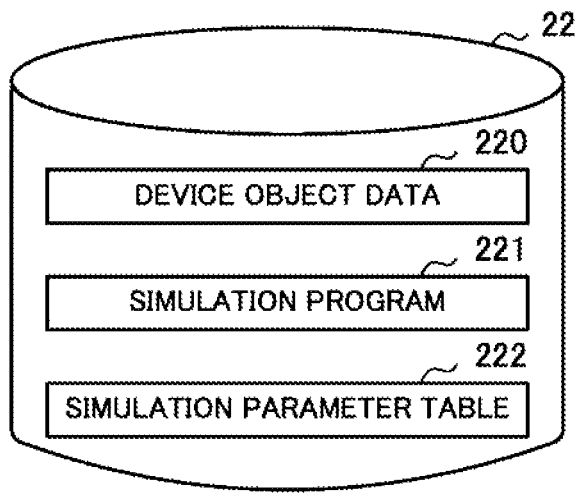
FIG. 3 is a diagram for explaining a data storage provided in the test device simulator of Embodiment 1.

Although various general-purpose programs, various data, and the like are stored in the data storage 22, as a configuration characteristic to the embodiment of the present disclosure, device object data 220, a simulation program 221, and a simulation parameter table 222 are stored, as illustrated in FIG. 3.

The device object data 220 is data extracted from a test device (such as an indoor device or an outdoor device, for example), and is data that includes information characteristic to the test device, operable control items, and the like.

The simulation program 221 is a program for simulating the behavior of a test device in the test device simulator 2, and is created in advance for each type of test device.

The simulation parameter table 222 is a data table storing parameters for simulating a test device. Parameters stored in the simulation parameter table 222 are configured and input by the user (discussed in detail later) after the activation of the above simulation program 221.

Figure 4:
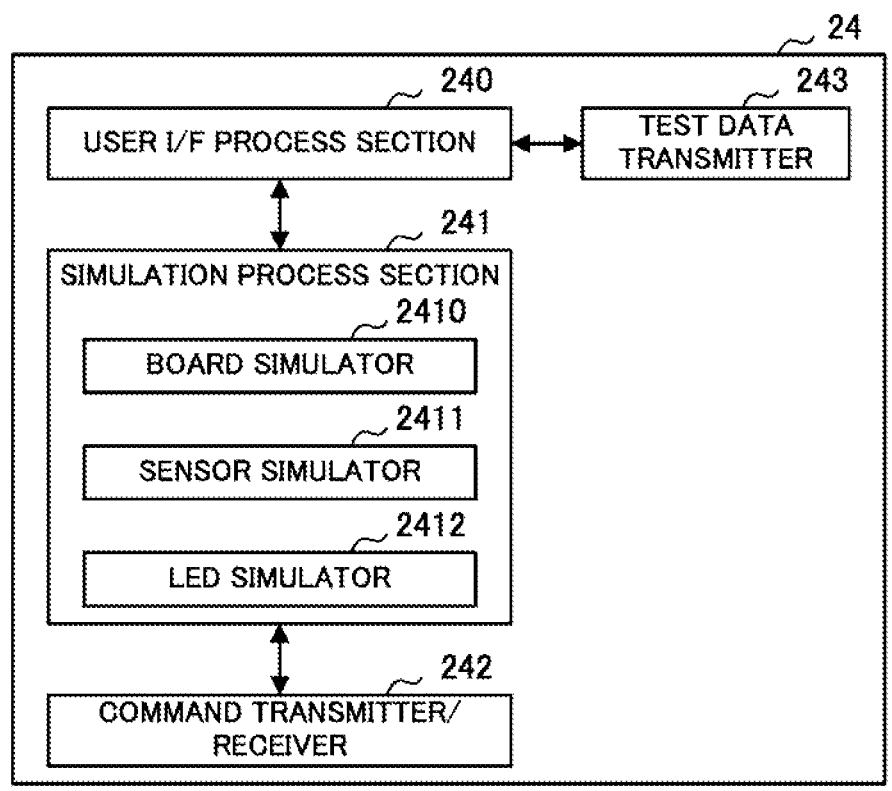
FIG. 4 is a block diagram illustrating a functional configuration of a controller provided in the test device simulator of Embodiment 1.

As a configuration characteristic to the embodiment of the present disclosure, the controller 24 functionally comprises a user I/F process section 240, a simulation process section 241, a command transmitter/receiver 242, and a test data transmitter 243, as illustrated in FIG. 4. The functionality of each of these functional components is realized by the CPU executing the above simulation program 221 stored in the data storage 22.

The user I/F process section 240 displays user I/F screens in a graphical user interface (GUI), receives various configurations to be discussed later for simulation from the user, and also displays test results and the like.

Figure 5:
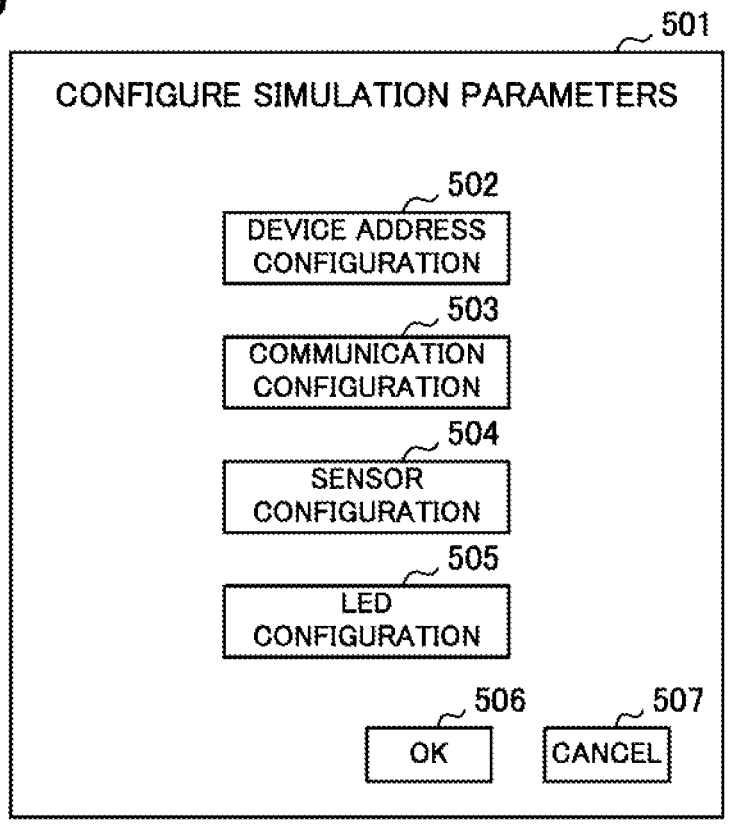
FIG. 5 is a diagram illustrating an example of a simulation parameter configuration screen of Embodiment 1.

More specifically, if the user performs a designated operation for activating the above simulation program 221 via the operation receiver 20, the user I/F process section 240 displays, via the display 21, a simulation parameter configuration screen 501 as illustrated in FIG. 5. The simulation parameter configuration screen 501 is a screen for configuring initial parameters (preconditions) for simulating a test device. As illustrated in FIG. 5, the simulation parameter configuration screen 501 includes a device address configuration button 502, a communication configuration button 503, a sensor configuration button 504, an LED configuration button 505, an OK button 506, a cancel button 507, and the like.

Figure 6:
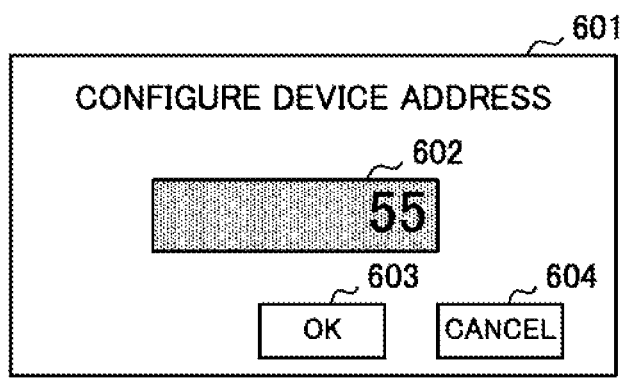
FIG. 6 is a diagram illustrating an example of a device address configuration screen of Embodiment 1.

If the user pushes the device address configuration button 502, the user I/F process section 240 presents a popup display of the device address configuration screen 601 illustrated in FIG. 6 on top of the simulation parameter configuration screen 501. The device address configuration screen 601 is a screen for enabling the user to configure a device address in the simulation to assign to a test device, and includes a device address input field 602, an OK button 603, a cancel button 604, and the like.

The device address input field 602 is a text box for inputting a device address. The user is able to directly input text of a desired device address (in the example of FIG. 6, "55") into the device address input field 602 via the operation receiver 20. If the user inputs a device address and pushes the OK button 603, the user I/F process section 240 acquires and stores the device address input by the user in the simulation parameter table 222, and closes the device address configuration screen 601. On the other hand, if the cancel button 604 is pushed, the user I/F process section 240 closes the device address configuration screen 601 without acquiring a device address input by the user.

Figure 7:
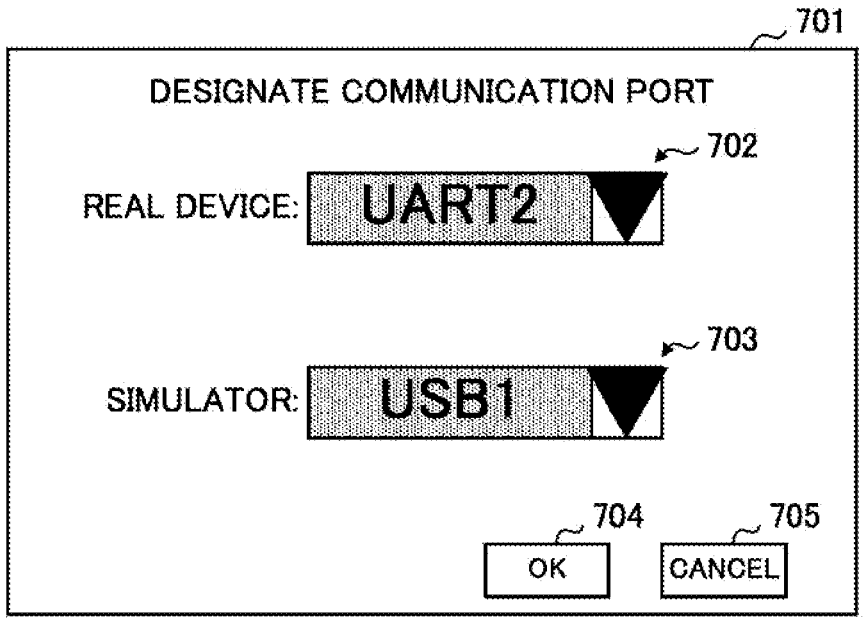
FIG. 7 is a diagram illustrating an example of a communication configuration screen of Embodiment 1.

On the simulation parameter configuration screen 501 of FIG. 5, if the user pushes the communication configuration button 503, the user I/F process section 240 presents a popup display of the communication configuration screen 701 illustrated in FIG. 7 on top of the simulation parameter configuration screen 501. The communication configuration screen 701 is a screen enabling the user to configure a port used for data communication on the control board provided in the test device, and a port of the test device simulator 2 connected to the air-conditioning network 4. As illustrated in FIG. 7, the communication configuration screen 701 includes a real device-side port specification field 702, a simulator-side port specification field 703, an OK button 704, a cancel button 705, and the like.

The real device-side port specification field 702 is a drop-down list for specifying a port on the side of the real device (test device). The user is able to select a port name corresponding to the test device (in the example of FIG. 7, "UART2") from a list of port names displayed in the real device-side port specification field 702 when pushed. The simulator-side port specification field 703 is a drop-down list for specifying a port of the test device simulator 2. The user is able to select a desired port (in the example of FIG. 7, "USB1") from a list of port names displayed in the simulator-side port specification field 703 when pushed. As in this example, in the present embodiment, the test device simulator 2 uses a USB port as the port to connect to the air-conditioning network 4.

If the user specifies respective port names for the real device-side and the simulator-side, and pushes the OK button 704, the user I/F process section 240 acquires and stores the respective port names for the real device-side and the simulator-side specified by the user in the simulation parameter table 222, and closes the communication configuration screen 701. On the other hand, if the cancel button 705 is pushed, the user I/F process section 240 closes the communication configuration screen 701 without acquiring these port names specified by the user.

Figure 8:
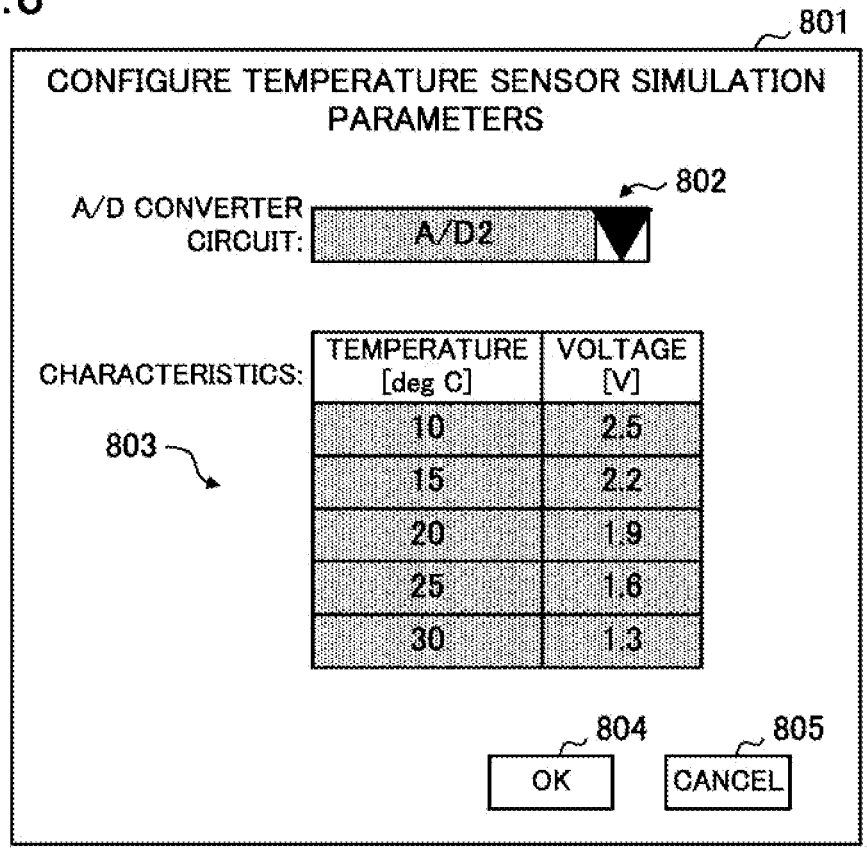
FIG. 8 is a diagram illustrating an example of a sensor configuration screen of Embodiment 1.

On the simulation parameter configuration screen 501 of FIG. 5, if the user pushes the sensor configuration button 504, the user I/F process section 240 presents a popup display of the sensor configuration screen 801 illustrated in FIG. 8 on top of the simulation parameter configuration screen 501. The sensor configuration screen 801 is a screen enabling the user to configure parameters for simulating the behavior of a sensor provided in the test device (for example, a temperature sensor). As illustrated in FIG. 8, the sensor configuration screen 801 includes an A/D converter circuit specification field 802, a characteristics input field 803, an OK button 804, a cancel button 805, and the like.

The A/D converter circuit specification field 802 is a drop-down list for specifying an A/D converter circuit to connect to the sensor on the control board provided in the test device. The user is able to select an A/D converter circuit name corresponding to the test device (in the example of FIG. 8, "A/D2") from a list of A/D converter circuit names displayed in the A/D converter circuit specification field 802 when pushed.

The characteristics input field 803 is a text box for inputting the characteristics of the sensor (in this example, a temperature sensor). The user is able to directly input text of the relationship between the temperature and the output voltage, derived from the specifications of the sensor, into the characteristics input field 803 as the characteristics of the sensor. The example of FIG. 8 indicates that when the temperature is 10° C., 15° C., 20° C., 25° C., and 30° C., the voltage output from the sensor is 2.5 V, 2.2 V, 1.9 V, 1.6 V, and 1.3 V, respectively.

If the user performs the above specification and input, and pushes the OK button 804, the user I/F process section 240 acquires and stores the A/D converter circuit name and sensor characteristics specified by the user in the simulation parameter table 222, and closes the sensor configuration screen 801. On the other hand, if the cancel button 805 is pushed, the user I/F process section 240 closes the sensor configuration screen 801 without acquiring the information specified and input by the user.

Figure 9:
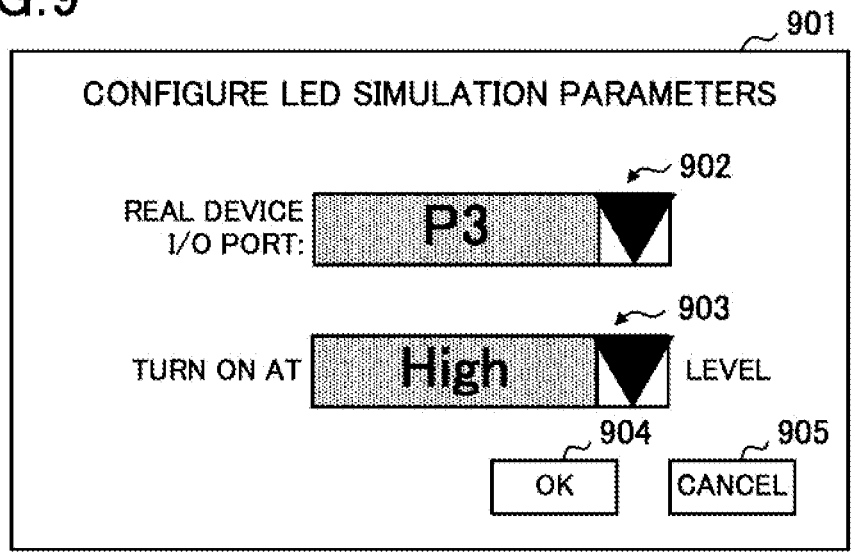
FIG. 9 is a diagram illustrating an example of an LED configuration screen of Embodiment 1.

On the simulation parameter configuration screen 501 of FIG. 5, if the user pushes the LED configuration button 505, the user I/F process section 240 presents a popup display of the LED configuration screen 901 illustrated in FIG. 9 on top of the simulation parameter configuration screen 501. The LED configuration screen 901 is a screen enabling the user to configure parameters for simulating the behavior of an LED provided in the test device. As illustrated in FIG. 9, the LED configuration screen 901 includes an LED port specification field 902, an ON parameter specification field 903, an OK button 904, a cancel button 905, and the like.

The LED port specification field 902 is a drop-down list for specifying an I/O port to connect to the LED on the control board provided in the test device. The user is able to select an I/O port name corresponding to the test device (in the example of FIG. 9, "P3") from a list of I/O port names displayed in the LED port specification field 902 when pushed.

The ON parameter specification field 903 is a drop-down list for specifying ON instruction information that is written to a register associated with the I/O port selected above in order to turn on the LED. The user is able to select ON instruction information corresponding to the control board of the test device (in the example of FIG. 9, "High") from a list of ON instruction information (for example, "High" and "Low") displayed in the ON parameter specification field 903 when pushed. This example indicates that "High" (for example, 1) is written to the register for the port P3 on the control board, which means that the LED is instructed to turn on. Also, in this case, by writing "Low" (for example, 0) to the register for the port P3, the LED may be instructed to turn off.

If the user performs the above specification, and pushes the OK button 904, the user I/F process section 240 acquires and stores the I/O port name and ON instruction information specified by the user in the simulation parameter table 222, and closes the LED configuration screen 901. On the other hand, if the cancel button 905 is pushed, the user I/F process section 240 closes the LED configuration screen 901 without acquiring these information specified by the user.

Figure 10:
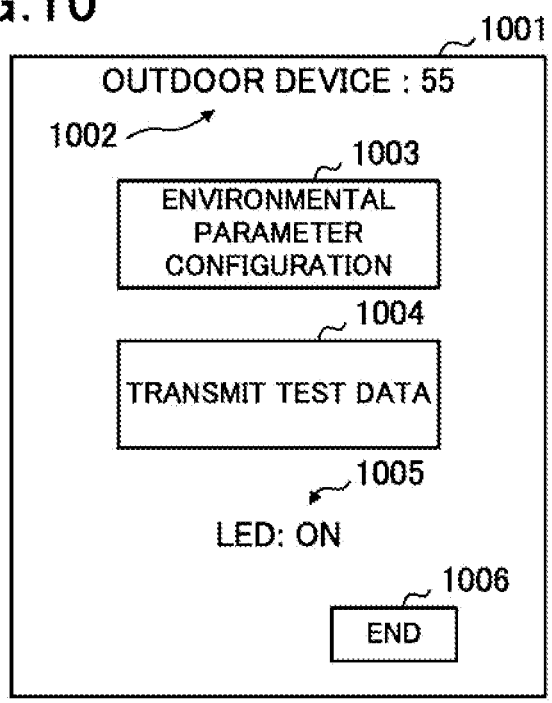
FIG. 10 is a diagram illustrating an example of a test operating screen of Embodiment 1.

Returning to the simulation parameter configuration screen 501 of FIG. 5, if the user pushes the OK button 506, the user I/F process section 240 checks the stored content of the simulation parameter table 222, and determines whether or not the user has completed the configuration of all simulation parameters. As a result, if the configuration of all simulation parameters is complete, the user I/F process section 240 activates the simulation process section 241 and the command transmitter/receiver 242, and also closes the simulation parameter configuration screen 501. In addition, the user I/F process section 240 displays a test operating screen 1001 as illustrated in FIG. 10.

On the other hand, if the configuration of all simulation parameters is not complete, the user I/F process section 240 displays an error message screen indicating this state. Note that if the configuration of predetermined necessary parameters (for example, the configuration of a device address and the specification of a communication port) is complete, the user I/F process section 240 may activate the simulation process section 241 and the command transmitter/receiver 242, regardless of whether or not the other parameters are configured.

On the other hand, on the simulation parameter configuration screen 501, if the user pushes the cancel button 507, the user I/F process section 240 deletes the stored content of the simulation parameter table 222. Subsequently, the user I/F process section 240 closes the simulation parameter configuration screen 501 without activating the simulation process section 241 and the command transmitter/receiver 242, and also ends execution of the simulation program 221 by the CPU.

While the simulation is being executed, the user I/F process section 240 displays the above test operating screen 1001. The test operating screen 1001 is a screen for receiving operations for performing tests from the user, and for displaying simulation results. As illustrated in FIG. 10, the test operating screen 1001 includes a real device information display field 1002, an environmental parameter configuration button 1003, a test data transmit button 1004, an LED state display field 1005, and end button 1006, and the like.

On the real device information display field 1002, the functional type of the test device (such as indoor device or outdoor device) and the device address previously configured by the user via the device address configuration screen 601 are displayed. Information indicating the functional type of a test device is included in the device object data 220.

The environmental parameter configuration button 1003 is a button used to receive from the user the configuration of a measured value in a sensor of the test device. The test data transmit button 1004 is a button used to receive from the user the configuration of the content of data for testing to transmit to another connected device (herein, the air-conditioning system simulator 3), and to transmit the data.

In the LED state display field 1005, one of either "LED: ON" or "LED: OFF" is displayed, on the basis of information reported by the simulation process section 241.

The simulation process section 241 conducts a process of simulating the behavior of the test device. More specifically, as illustrated in FIG. 4, the simulation process section 241 comprises a board simulator 2410, a sensor simulator 2411, and an LED simulator 2412.

The board simulator 2410 simulates the behavior of the control board provided in the test device, on the basis of the device object data 220. In this simulation, the board simulator 2410 acquires external information according to a similar process as the control board. For example, the board simulator 2410 acquires information from the sensor simulator 2411 to be discussed later from a register corresponding to an A/D converter circuit predetermined according to the specifications of the control board (for example, the A/D converter circuit labeled "A/D2").

As another example, the board simulator 2410 acquires data from the command transmitter/receiver 242 to be discussed later (for example, data such as control commands that are exchanged among real devices) from a receive buffer associated with a communication port predetermined according to the specifications of the control board (for example, the communication port labeled "UART2").

Additionally, in this simulation, the board simulator 2410 instructs an LED to turn on or off and transmits data according to a similar process as the control board. For example, if it is necessary to instruct an LED to turn on or off, the board simulator 2410 writes ON instruction information (for example, "High") or OFF instruction information (for example, "Low") to a register corresponding to I/O predetermined according to the specifications of the control board (for example, the I/O port labeled "P3").

As another example, if it is necessary to transmit data such as a control command, the board simulator 2410 writes a generated control command or the like to a transmit buffer corresponding to a communication port predetermined according to the specifications of the control board (for example, the UART port labeled "UART2").

The sensor simulator 2411 simulates the behavior of a sensor provided in the test device (for example, a temperature sensor), on the basis of a sensor simulation parameter configured by the user via the sensor configuration screen 801, and an environmental parameter to be discussed later.

The user is able to configure an arbitrary environmental parameter (for example, an indoor temperature) via the test operating screen 1001 of FIG. 10. If the user pushes the environmental parameter configuration button 1003 of the test operating screen 1001, the user I/F process section 240 presents a popup display of the environmental parameter configuration screen 1101 illustrated in FIG. 11 on top of the test operating screen 1001.

Figure 11:
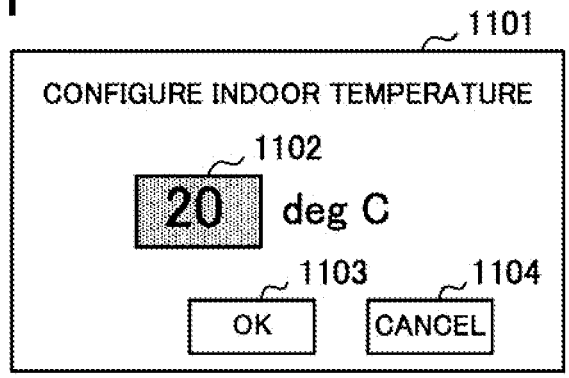
FIG. 11 is a diagram illustrating an example of an environmental parameter configuration screen of Embodiment 1.

The environmental parameter configuration screen 1101 is a screen enabling the user to configure an indoor temperature measured by a sensor provided in the test device. As illustrated in FIG. 11, the environmental parameter configuration screen 1101 includes an indoor temperature input field 1102, an OK button 1103, a cancel button 1104, and the like.

The indoor temperature input field 1102 is a text box for inputting an indoor temperature. The user is able to directly input text of a desired indoor temperature (in the example of FIG. 11, "20" ° C.) into the indoor temperature input field 1102 via the operation receiver 20. If the user inputs an indoor temperature and pushes the OK button 1103, the user I/F process section 240 acquires and supplies the indoor temperature input by the user to the sensor simulator 2411. On the other hand, if the cancel button 1104 is pushed, the user I/F process section 240 closes the environmental parameter configuration screen 1101 without acquiring an indoor temperature input by the user.

The sensor simulator 2411, when supplied with an indoor temperature from the user I/F process section 240, acquires a voltage value corresponding to that indoor temperature on the basis of the temperature sensor characteristics (see FIG. 8) previously configured by the user, and writes the acquired voltage value to a register corresponding to the A/D converter circuit name (for example, "A/D2") previously configured by the user. In the case in which the configured indoor temperature is 20° C., in the example of FIG. 8, 1.9 [V] is acquired as the corresponding voltage value and written to the above register. Consequently, the board simulator 2410 is able to acquire such a voltage value as a measurement result of the temperature sensor.

The LED simulator 2412 issues a report with an instruction to turn on or turn off the LED to the user I/F process section 240, on the basis of LED simulation parameters configured by the user, and ON instruction information or OFF instruction information output from the board simulator 2410. Specifically, the LED simulator 2412 checks a register corresponding to an PO port configured by the user (for example, the I/O port labeled "P3") at a designated interval, and retrieves information written to that register (ON instruction information or OFF instruction information). In the case of ON instruction information, the LED simulator 2412 instructs the user I/F process section 240 to turn on the LED, and in the case of OFF instruction information, instructs the user OF process section 240 to turn off the LED. Consequently, one of either "LED: ON" or "LED: OFF" is displayed in the LED state display field 1005 of the test operating screen 1001.

The command transmitter/receiver 242, on the basis of the user-configured result on the communication configuration screen 701 (see FIG. 7), conducts a process that mediates the exchange of data between a port used for data communication on the control board of the test device, and a port of the test device simulator 2 connected to the air-conditioning network 4. Data (such as a control command, for example) output to the air-conditioning network 4 from another simulator (herein, the air-conditioning system simulator 3) is taken up by the external inputter/outputter 23 via the protocol converter 5. The data taken up by the external inputter/outputter 23 is written to a receive buffer of a port used by the external inputter/outputter 23, or in other words, the simulator-side port (for example, the USB port corresponding to "USB1") configured by the user.

The command transmitter/receiver 242 retrieves and writes data from this receive buffer to a receive buffer corresponding to a control board-side port (for example, the communication port labeled "UART2") configured by the user.

Also, if the board simulator 2410 writes data such as a control command to a transmit buffer corresponding to the above control board-side port as discussed earlier, the command transmitter/receiver 242 retrieves and writes this data to a transmit buffer of the above simulator-side port. The external inputter/outputter 23 outputs data written to this transmit buffer onto the air-conditioning network 4 via the protocol converter 5. Data output onto the air-conditioning network 4 is received by another simulator (herein, the air-conditioning system simulator 3).

The test data transmitter 243 conducts a process of transmitting test data (a control command) arbitrarily configured by the user to another simulator (herein, the air-conditioning system simulator 3). The user is able to generate and transmit arbitrary test data via the test operating screen 1001 of FIG. 10. If the user pushes the test data transmit button 1004 of the test operating screen 1001, the user I/F process section 240 presents a popup display of the test data configuration screen 1201 illustrated in FIG. 12 on top of the test operating screen 1001.

Figure 12:
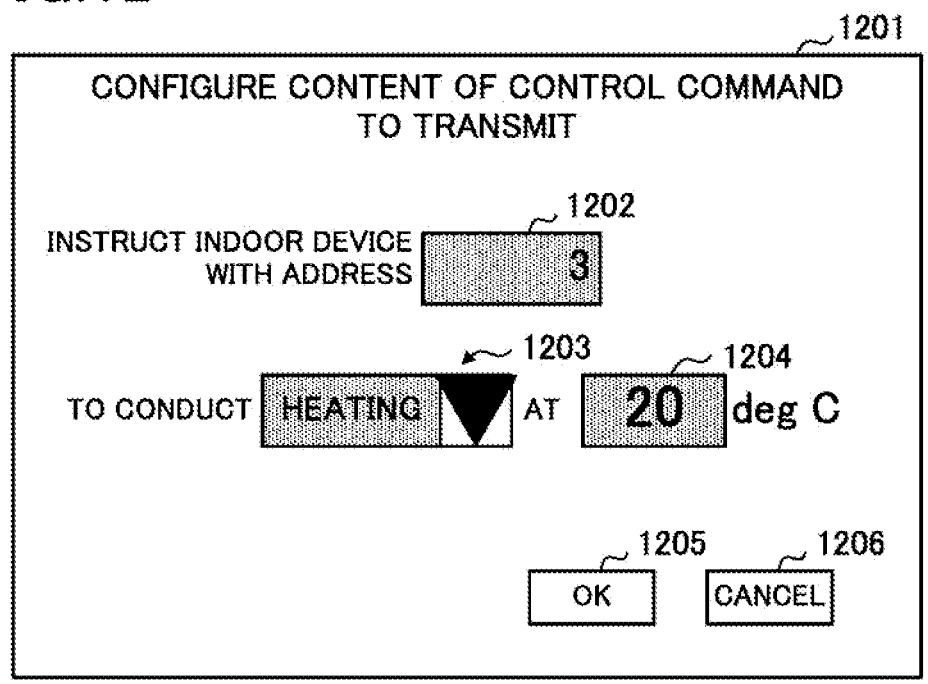
FIG. 12 is a diagram illustrating an example of a test data configuration screen of Embodiment 1.

As illustrated in FIG. 12, the test data configuration screen 1201 includes an address input field 1202, an operating mode specification field 1203, a set temperature input field 1204, an OK button 1205, a cancel button 1206, and the like.

The address input field 1202 is a text box for inputting a device address of a recipient real device to which the control command is addressed. The operating mode specification field 1203 is a drop-down list for specifying an operating mode (such as heating, cooling, or fan) to instruct to the recipient real device. The set temperature input field 1204 is a text box for inputting a set temperature to instruct to the recipient real device.

The example of FIG. 12 illustrates that an indoor device with the device address "3" is instructed to conduct heating operation at 20° C. If the user configures the content of test data (a control command) in this way and pushes the OK button 1205, the user I/F process section 240 reports the content of the test data configured by the user to the test data transmitter 243.

The test data transmitter 243 generates a control command on the basis of the reported test data content. The format of the control command generated at this point is the same as the format of a control command used in an actual air-conditioning system. The test data transmitter 243 writes the generated control command to the transmit buffer of the simulator-side port (for example, the USB port corresponding to "USB1") previously configured by the user.

The external inputter/outputter 23 outputs a control command written to this transmit buffer of the above port used by the external inputter/outputter 23 itself onto the air-conditioning network 4 via the protocol converter 5. Consequently, such a control command is received by the air-conditioning system simulator 3.

On the test data configuration screen 1201, if the user pushes the cancel button 1206, the user I/F process section 240 closes the test data configuration screen 1201 without reporting the content of test data configured by the user to the test data transmitter 243.

Returning to the test operating screen 1001 of FIG. 10, if the user pushes the end button 1006, the user I/F process section 240 closes the test operating screen 1001, and also ends execution of the simulation program 221 by the CPU.

Next, the air-conditioning system simulator 3 will be described. The air-conditioning system simulator 3 is a device for simulating the behavior of multiple other real devices (testing devices) in an air-conditioning system to which the test device discussed above belongs.

The air-conditioning system simulator 3 comprises a configuration similar to the test device simulator 2. In other words, as illustrated in FIG. 2, an operation receiver 20, a display 21, a data storage 22, an external inputter/outputter 23, and a controller 24 are provided.

Figure 13:
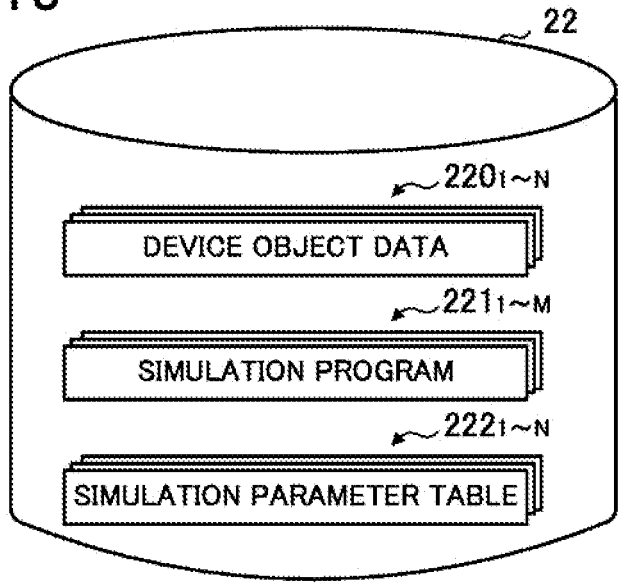
FIG. 13 is a diagram for explaining a data storage provided in the air-conditioning system simulator of Embodiment 1.

As illustrated in FIG. 13, the data storage 22 of the air-conditioning system simulator 3, unlike the case of the test device simulator 2, stores multiple device object data $220_{1-N}$, multiple simulation programs $221_{1-M}$, and multiple simulation parameter tables $222_{1-N}$.

Each of the device object data $220_{1-N}$ corresponds to a respective testing device to simulate. Also, each of the simulation parameter tables $222_{1-N}$ stores parameters for simulating a respective testing device. In the present embodiment, N testing devices (where N is an integer equal to or greater than 2) are simulated.

Each of the simulation programs $221_{1-M}$ is created in advance for each type of testing device to simulate. In the present embodiment, the total number of types of testing devices to simulate is M (where M is an integer equal to or greater than 2)

In the air-conditioning system simulator 3, when the user starts execution of the simulation of a testing device, the simulation programs 221 corresponding to the type of that testing device is selected and activated from among the simulation programs $221_{1-M}$. Additionally, similarly to the case of the test device simulator 2 discussed earlier, initial parameters (preconditions) for simulating that testing device are configured via the simulation parameter configuration screen 501. The user conducts such operations for all testing devices to be simulated.

Figure 14:
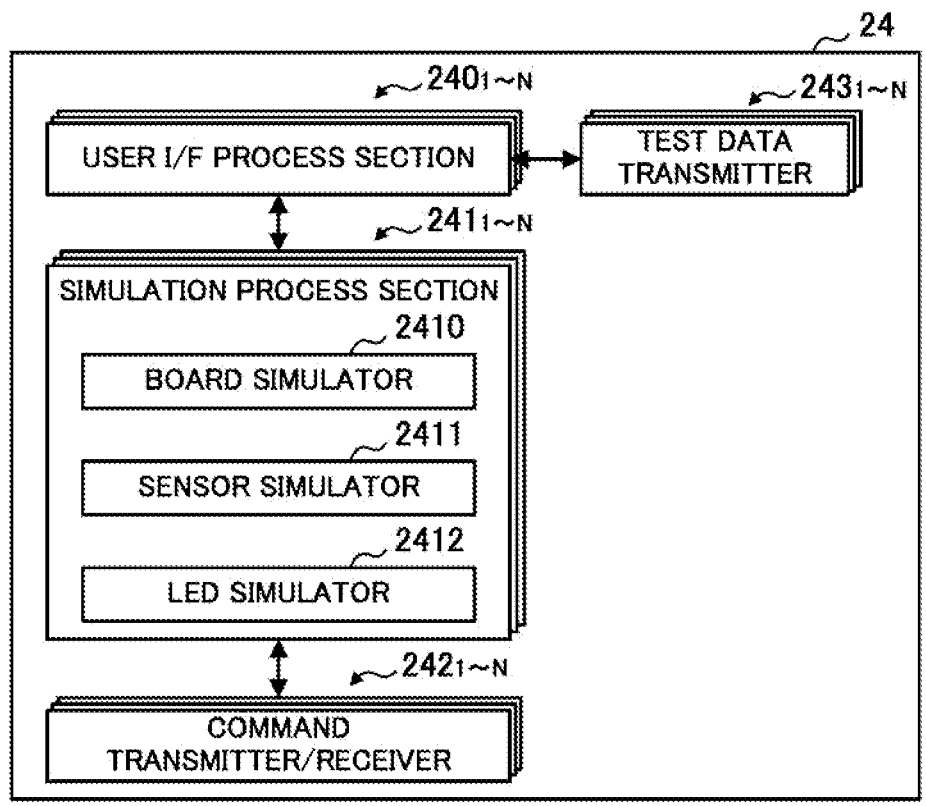
FIG. 14 is a block diagram illustrating a functional configuration of a controller provided in the air-conditioning system simulator of Embodiment 1.

After the user conducts the above operations, the functional configuration of the controller 24 of the air-conditioning system simulator 3 becomes like that illustrated in FIG. 14. In this way, after the configuration of initial parameters is completed for all testing devices to be simulated, the controller 24 of the air-conditioning system simulator 3 is functionally configured with multiple user I/F process sections $240_{1-N}$, multiple simulation process sections $241_{1-N}$, multiple command transmitters/receivers $242_{1-N}$, and multiple test data transmitters $243_{1-N}$.

In other words, each user I/F process section 240, each simulation process section 241, each command transmitter/receiver 242, and each test data transmitter 243 executes a process that simulates the behavior of one testing device. In this case, N test operating screens 1001 (see FIG. 10) corresponding to each testing device are displayed on the display 21.

In the air-conditioning system simulator 3, each process due to a user operation via each test operating screen 1001 is similar to the case of the test device simulator 2 discussed earlier.

Next, an example of an operational test of a test device using the air conditioner testing system 1 configured as above will be described. In this test example, in the case of instructing a specific testing device (an indoor device with the device address "3") to conduct heating operation, the user checks that a test device (an outdoor device with the device address "55") starts operating when the indoor temperature is less than the set temperature. Note that as a prerequisite to conducting this test, assume that in the test device simulator 2, the configuration of initial parameters for simulating the test device is complete, and the test operating screen 1001 is being displayed. Similarly, assume that in the air-conditioning system simulator 3, the configuration of initial parameters for simulating each testing device is complete, and a number of corresponding test operating screens 1001 equal to the number of testing devices are being displayed.

Under the above conditions, first, in the air-conditioning system simulator 3, the user operates the test operating screen 1001 corresponding to the device address "3" to display the environmental parameter configuration screen 1101 (see FIG. 11), and on this screen configures the indoor temperature to 25° C. Consequently, the sensor simulator 2411 of the simulation process section 241 corresponding to the device address "3" outputs a voltage value corresponding to the indoor temperature "25° C." (for example, 1.6 [V]) as a measurement result to the board simulator 2410, as discussed earlier.

Next, in the test device simulator 2, the user operates the test operating screen 1001 to display the test data transmission screen 1201 (see FIG. 12). Subsequently, on this screen, the user makes a configuration instructing the indoor device with the device address "3" to conduct heating operation at 20° C., and pushes the OK button 1205. Thus, as discussed earlier, the test data transmitter 243 generates a control command corresponding to the configured operating instruction content, and the generated control command is output onto the air-conditioning network 4 via the protocol converter 5 by the external inputter/outputter 23 of the test device simulator 2.

The air-conditioning system simulator 3 receives the control command, and the board simulator 2410 corresponding to the device address "3" recognizes the content of the control command, that is, the instruction for heating operation at 20° C. However, in this case, since the indoor temperature is greater than the set temperature, the board simulator 2410 puts the operation corresponding to the operating instruction in a deferred state without immediately executing.

Next, in the air-conditioning system simulator 3, the user operates the test operating screen 1001 corresponding to the device address "3", and configures the indoor temperature to 15° C. on the environmental parameter configuration screen 1101 (see FIG. 11). Consequently, the sensor simulator 2411 corresponding to the device address "3" outputs a voltage value corresponding to the indoor temperature "15° C." (for example, 2.2 [V]) as a measurement result to the board simulator 2410.

The board simulator 2410 corresponding to the device address "3" detects that the indoor temperature has become less than the set temperature, generates a control command requesting heating operation at 20° C. for the outdoor device with the device address "55" (that is, the test device), and as discussed earlier, writes the generated control command to the transmit buffer corresponding to the control board-side port (for example, the communication port labeled "UART2").

The command transmitter/receiver 242 corresponding to the device address "3" retrieves the control command written to the above transmit buffer, and writes the retrieved control command to the transmit buffer of the simulator-side port. The external inputter/outputter 23 outputs data written to this transmit buffer onto the air-conditioning network 4 via the protocol converter 5. The control command output onto the air-conditioning network 4 is received by the test device simulator 2. The board simulator 2410 of the test device simulator 2 recognizes the content of the control command, that is, the request for heating operation at 20° C., and executes a process related to heating operation in accordance with the request. In order to notify the user that heating operation behavior is being conducted, the board simulator 2410 writes ON instruction information (for example, "High") to a register corresponding to I/O predetermined according to the specifications of the control board (for example, the I/O port labeled "P3").

After the ON instruction information is written to the above register, the LED simulator 2412 instructs the user IT process section 240 to turn on the LED, as discussed earlier. The user IT process section 240, upon receiving the instruction, displays "LED: ON" in the LED state display field 1005 of the test operating screen 1001. Consequently, the user is able to recognize that the test device (that is, the outdoor device with the device address "55") has started heating operation behavior normally.

Figure 15:
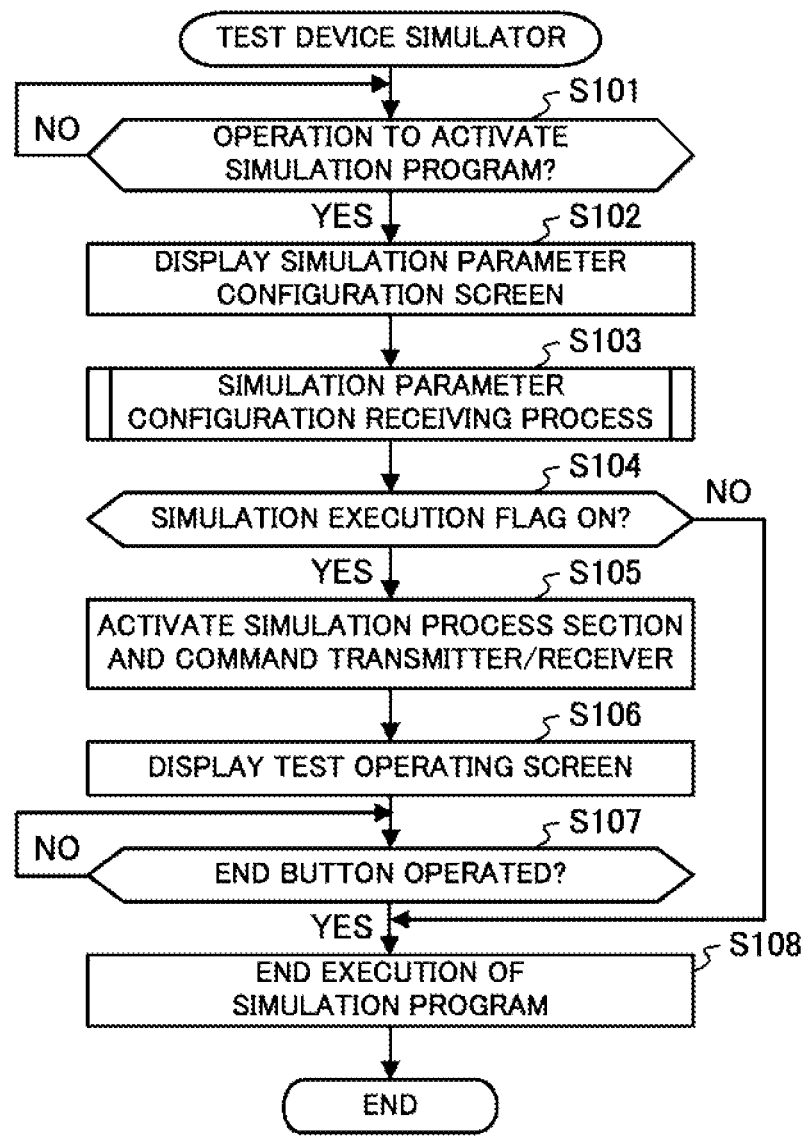
FIG. 15 is a flowchart illustrating a sequence of simulation operations in the test device simulator of Embodiment 1.

FIG. 15 is a flowchart illustrating a sequence of simulation operations in the test device simulator 2. If the user conducts a designated operation for activating the simulation program 221 via the operation receiver 20 (step S101; YES), the user IT process section 240 displays the simulation parameter configuration screen 501 (see FIG. 5) via the display 21 (step S102), and executes a simulation parameter configuration receiving process (step S103).

Figure 16:
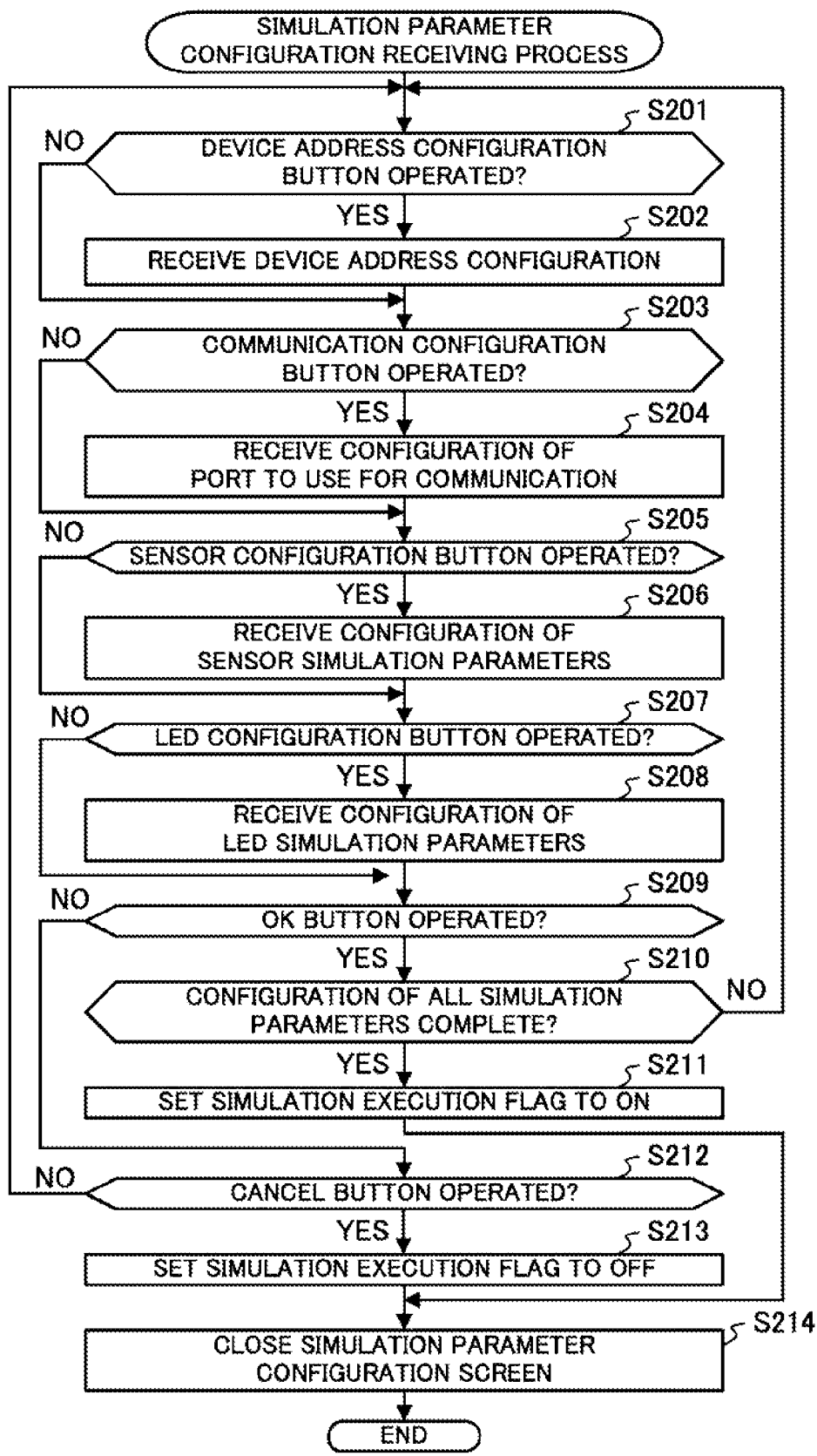
FIG. 16 is a flowchart illustrating a sequence of a simulation parameter configuration receiving process in the test device simulator of Embodiment 1.

FIG. 16 is a flowchart illustrating a sequence of this simulation parameter configuration receiving process. If the user pushes the device address configuration button 502 on the simulation parameter configuration screen 501 (step S201; YES), the user IT process section 240 receives the configuration of a device address from the user, as discussed earlier (step S202).

If the user pushes the communication configuration button 503 on the simulation parameter configuration screen 501 (step S203; YES), the user IT process section 240 receives the configuration of a port to use for communication from the user, as discussed earlier (step S204).

If the user pushes the sensor configuration button 504 on the simulation parameter configuration screen 501 (step S205; YES), the user IT process section 240 receives the configuration of sensor simulation parameters from the user, as discussed earlier (step S206).

If the user pushes the LED configuration button 505 on the simulation parameter configuration screen 501 (step S207; YES), the user IT process section 240 receives the configuration of LED simulation parameters from the user, as discussed earlier (step S208).

If the user pushes the OK button 506 on the simulation parameter configuration screen 501 (step S209; YES), the user I/F process section 240 determines whether or not the user has completed the configuration of all simulation parameters (step S210). As a result, in the case in which the configuration of all simulation parameters is complete (step 210; YES), the user I/F process section 240 turns on a simulation execution flag indicating whether or not to execute a simulation process (step S211), and closes the simulation parameter configuration screen 501 (step S214).

On the other hand, if the configuration of all simulation parameters is not complete (step S210; NO), the user I/F process section 240 reports this state to the user by displaying an error message screen or the like. Subsequently, the process of the user I/F process section 240 returns to step S201.

If the user pushes the cancel button 507 on the simulation parameter configuration screen 501 (step S212; YES), the user I/F process section 240 turns off the above simulation execution flag (step S213), and closes the simulation parameter configuration screen 501 (step S214).

Returning to the flowchart of FIG. 15, in step S104, the user I/F process section 240 determines whether or not the simulation execution flag is ON. If the simulation execution flag is OFF (step S104; NO), the user I/F process section 240 ends execution of the simulation program 221 by the CPU (step S108). On the other hand, if the simulation execution flag is ON (step S104; YES), the user I/F process section 240 activates the simulation process section 241 and the command transmitter/receiver 242 (step S105). Also, the user I/F process section 240 displays the test operating screen 1001 (see FIG. 10) (step S106).

Consequently, the simulation process section 241 starts simulating the behavior of the test device. Additionally, the user is able to configure arbitrary test parameters via the test operating screen 1001.

If the user pushes the end button 1006 of the test operating screen 1001 (step S107; YES), the user I/F process section 240 ends execution of the simulation program 221 by the CPU (step S108).

The sequence of simulation operations in the air-conditioning system simulator 3 is similar to the case of the test device simulator 2 discussed above. In the air-conditioning system simulator 3, for each testing device, it is sufficient for the user to activate a corresponding simulation program 221, and similarly to the case of the test device simulator 2 discussed above, configure initial parameters for simulating that testing device via the simulation parameter configuration screen 501.

As described above, according to an air conditioner testing system 1 of the present embodiment, the behavior of respective real devices constituting an air-conditioning system are simulated by a simulator. Consequently, constructing an air-conditioning system is easy, and a large work space is not required.

In addition, in both the test device simulator 2 and the air-conditioning system simulator 3, since a simulation is conducted using device object data extracted from a real device as-is without alteration, it becomes possible to realize a simulation that conforms to the behavior of the real device as much as possible.

Also, the board simulator 2410 faithfully imitates the behavior of a control board of a real device, without conducting special operations for simulation. For example, regarding the input and output of information, since the board simulator 2410 uses registers and buffers pre-associated with ports according to the specifications of the control board of the real device, no special simulation operations of any kind are conducted. For this reason, the behavior of the control board of a real device may be faithfully imitated.

Also, the sensor simulator 2411 and the LED simulator 2412 are respectively able to simulate the behavior of peripheral devices connected to the control board, such as a sensor and an LED. For this reason, the behavior of a real device may be imitated even more faithfully, and the quality of operational testing may be improved.

Also, during execution of the simulation, the configuration of an arbitrary environmental parameter (for example, an indoor temperature) may be received from the user, and in addition, test data (a control command) arbitrary configured by the user may also be transmitted to another simulator. Consequently, convenience and workability during testing is potentially improved.

Note that in the present embodiment, although a temperature sensor is exemplified as the sensor provided in the air conditioner, this is merely an example. For example, the sensor simulator 2411 of a simulation process section 241 in the test device simulator 2 or the air-conditioning system simulator 3 may also be configured to simulate the behavior of a humidity sensor.

In addition, it may also be configured such that data communication between the test device simulator 2 and the air-conditioning system simulator 3 is conducted via a general computer network such as a local area network (LAN).

(Embodiment 2)

Next, an air conditioner testing system according to Embodiment 2 of the present disclosure will be described. Note that in the following description, structural elements shared in common with the air conditioner testing system 1 of Embodiment 1 will be denoted with the same signs, and description thereof will be reduced or omitted.

Figure 17:
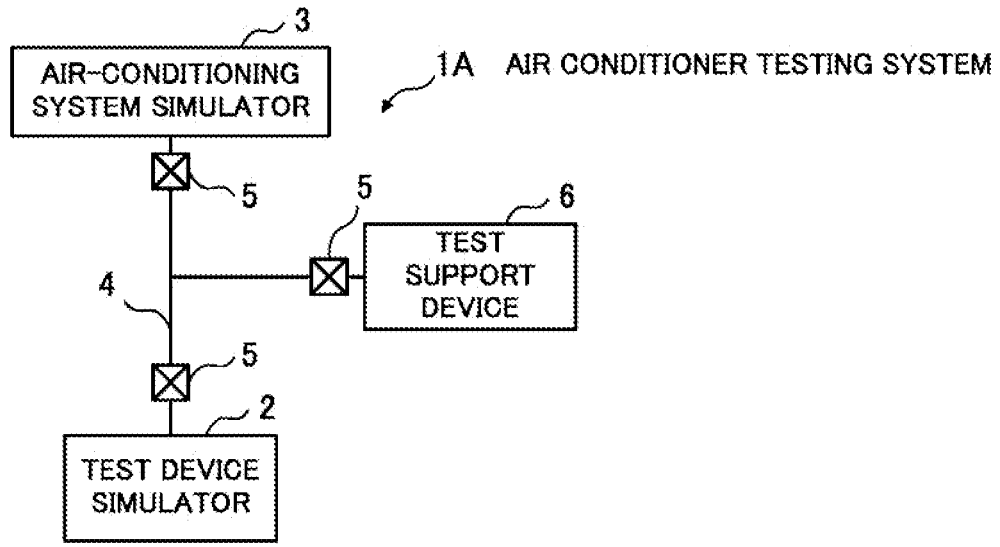
FIG. 17 is a diagram illustrating a configuration of an air conditioner testing system according to Embodiment 2 of the present disclosure.

FIG. 17 is a block diagram illustrating a configuration of an air conditioner testing system 1A of Embodiment 2. This air conditioner testing system 1A is configured as the air conditioner testing system 1 of Embodiment 1 with the addition of a test support device 6. The test support device 6, similarly to the test device simulator 2 and the air-conditioning system simulator 3, is connected to the air-conditioning network 4 via a protocol converter 5.

The test support device 6 is a device for providing support for performing simulated communication testing with a test device. The test support device 6 comprises a similar configuration as the test device simulator 2 and the air-conditioning system simulator 3. In other words, as illustrated in FIG. 2, the test support device 6 comprises an operation receiver 20, a display 21, a data storage 22, an external inputter/outputter 23, and a controller 24.

Figure 18:
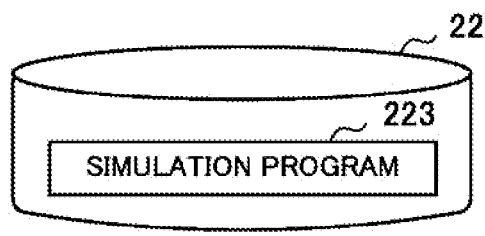
FIG. 18 is a diagram for explaining a data storage provided in the test support device of Embodiment 2.

Although various general-purpose programs, various data, and the like are stored in the data storage 22 of the test support device 6, as a configuration characteristic to the embodiment of the present disclosure, a simulation program 223 is stored, as illustrated in FIG. 18. The simulation program 223 is a program for conducting simulated communication operations with a test device.

Figure 19:
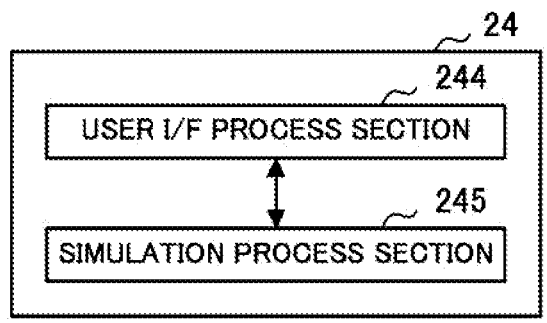
FIG. 19 is a block diagram illustrating a functional configuration of a controller provided in the test support device of Embodiment 2.

As a configuration characteristic to the embodiment of the present disclosure, the controller 24 of the test support device 6 functionally comprises a user I/F process section 244 and a simulation process section 245, as illustrated in FIG. 19. The functionality of each of these functional components is realized by the CPU executing the above simulation program 223 stored in the data storage 22.

Figure 20:
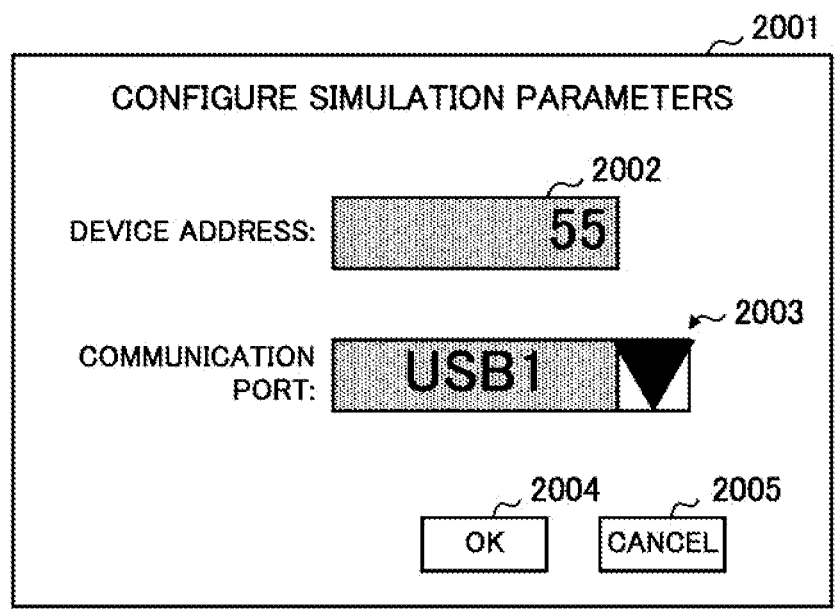
FIG. 20 is a diagram illustrating an example of a simulation parameter configuration screen of Embodiment 2.

If the user performs a designated operation for activating the above simulation program 223 via the operation receiver 20, the user I/F process section 244 displays, via the display 21, a simulation parameter configuration screen 2001 as illustrated in FIG. 20. The simulation parameter configuration screen 2001 is a screen enabling the user to configure initial parameters (preconditions) of a simulation. As illustrated in FIG. 20, the simulation parameter configuration screen 2001 includes a device address input field 2002, a port specification field 2003, an OK button 2004, a cancel button 2005, and the like.

The device address input field 2002 is a text box for inputting a device address to assign to the test support device 6 in order to communicate with the test device. The user is able to directly input text of a desired device address (in the example of FIG. 20, "55") into the device address input field 2002 via the operation receiver 20.

The port specification field 2003 is a drop-down list for specifying a port of the test support device 6 to connect to the air-conditioning network 4. The user is able to select a desired port (in the example of FIG. 20, "USB1") from a list of port names displayed in the port specification field 2003 when pushed.

Figure 21:
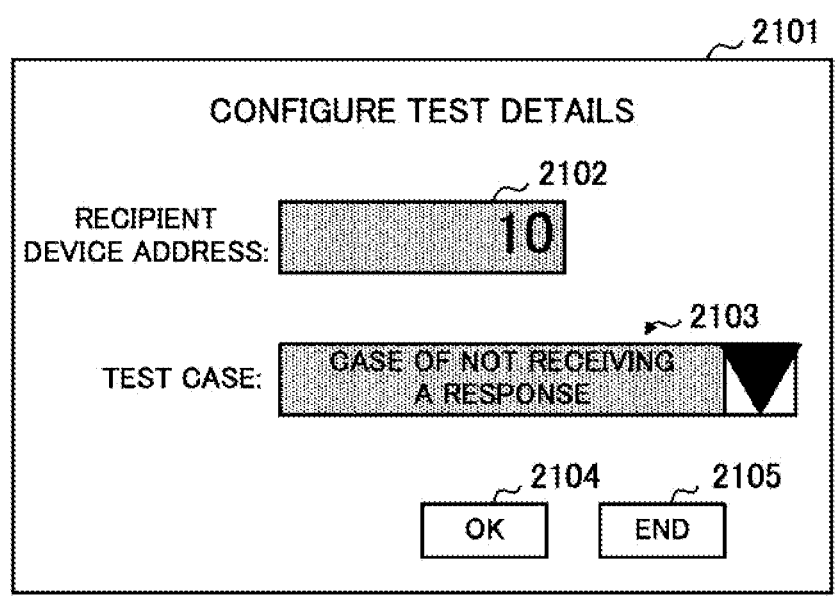
FIG. 21 is a diagram illustrating an example of a test operating screen of Embodiment 2.

If the user completes the input of a device address and the specification of a port name, and pushes the OK button 2004, the user I/F process section 244 acquires the device address and port name input and specified by the user, reports to the simulation process section 245, and closes simulation parameter configuration screen 2001. Subsequently, the user I/F process section 244 displays a test operating screen 2101 as illustrated in FIG. 21.

On the other hand, if the cancel button 2005 is pushed, the user I/F process section 244 closes the simulation parameter configuration screen 2001 without acquiring a device address and port name input and specified by the user, and ends execution of the simulation program 223 by the CPU.

The test operating screen 2101 is a screen for receiving operations for performing a communication test from the user, and includes a recipient device address input field 2102, a test case specification field 2103, an OK button 2104, an end button 2105, and the like. The recipient device address input field 2102 is a text box for inputting a device address of the communication recipient. The user is able to directly input text of a device address assigned to the test device (in the example of FIG. 21, "10") into the recipient device address input field 2102.

The test case specification field 2103 is a drop-down list for specifying a test case. The user is able to select a desired test case (in the example of FIG. 21, the "case of not receiving a response") from a list of test case names displayed in the test case specification field 2103 when pushed. The "case of not receiving a response" refers to a test case of "when receiving a control command indicating a request from the test device, transmit Ack only", or in other words, means a test case in which the test device is unable to receive a control command indicating a response.

If the user completes the input of a recipient device address and the specification of a test case name, and pushes the OK button 2104, the user I/F process section 244 supplies the recipient device address and test case name to the simulation process section 245. On the other hand, if the user pushes the end button 2105, the user I/F process section 244 closes the test operating screen 2101, and also ends execution of the simulation program 223 by the CPU.

Figures 22, 23A:
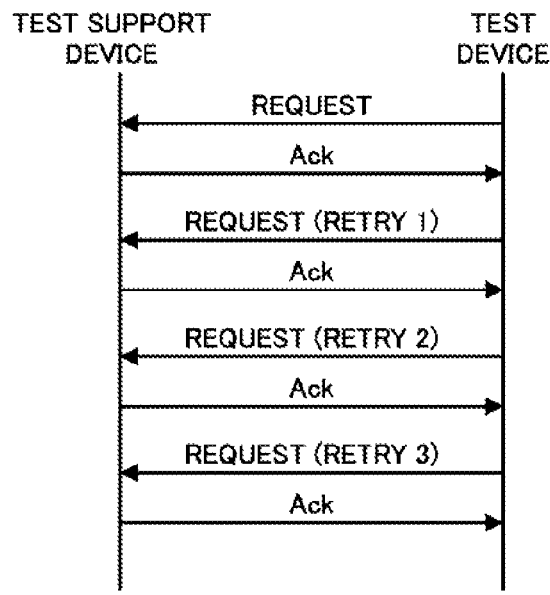
FIG. 22 is a diagram illustrating an example of a script corresponding to the "case of not receiving a response" in Embodiment 2.
FIG. 23A is a diagram illustrating a normal communication sequence in the "case of not receiving a response" in Embodiment 2.

The simulation process section 245, when supplied with a recipient device address and test case name from the user I/F process section 244, generates a script as illustrated in FIG. 22 on the basis thereof. FIG. 22 illustrates an example of a script in the case in which the user input "10" as the recipient device address, and specified the "case of not receiving a response" as the test case. Subsequently, the simulation process section 245, following the generated script, conducts data communication with the test device (that is, the test device simulator 2).

The simulation process section 245 determines whether or not the communication sequence was normal from the result of the communication with the test device, and reports the determination result to the user I/F process section 244. After receiving such a report, the user I/F process section 244 presents a popup display of a screen (not illustrated) indicating the determination result of the simulation process section 245 on top of the test operating screen 2101.

Figure 23B:
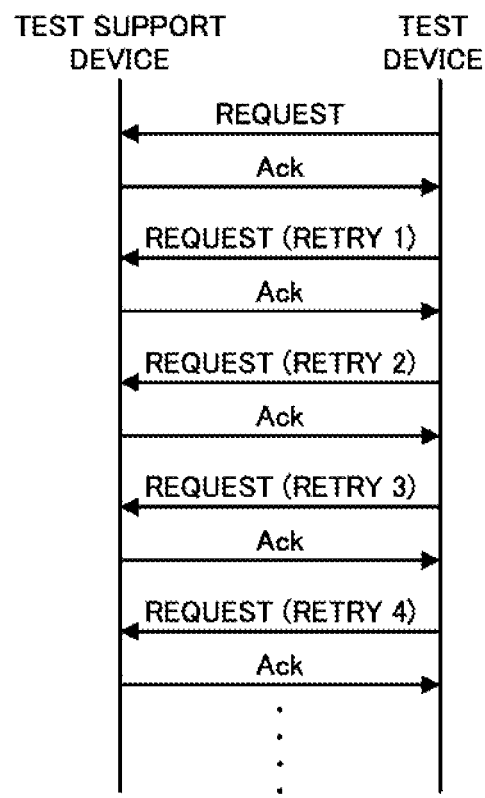
FIG. 23B is a diagram illustrating a (first) example of an abnormal communication sequence in the "case of not receiving a response" in Embodiment 2.
Figure 23C:
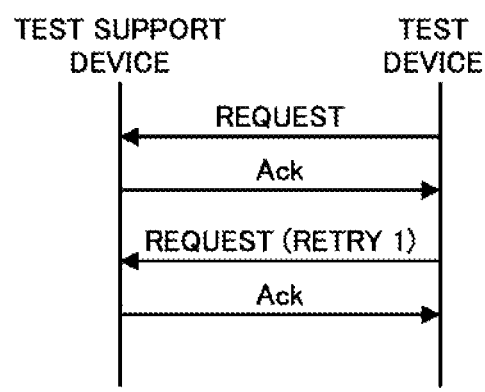
FIG. 23C is a diagram illustrating a (second) example of an abnormal communication sequence in the "case of not receiving a response" in Embodiment 2.

For example, in the "case of not receiving a response", suppose that in the correct communication sequence, a control command indicating a request from the test device is resent three times, as illustrated in FIG. 23A. Consequently, in the case in which the control command indicating the request from the test device is resent four or more times as illustrated in FIG. 23B, or resent only one time as illustrated in FIG. 23C, the simulation process section 245 determines that the communication sequence for that test was abnormal.

Figures 24, 25A:
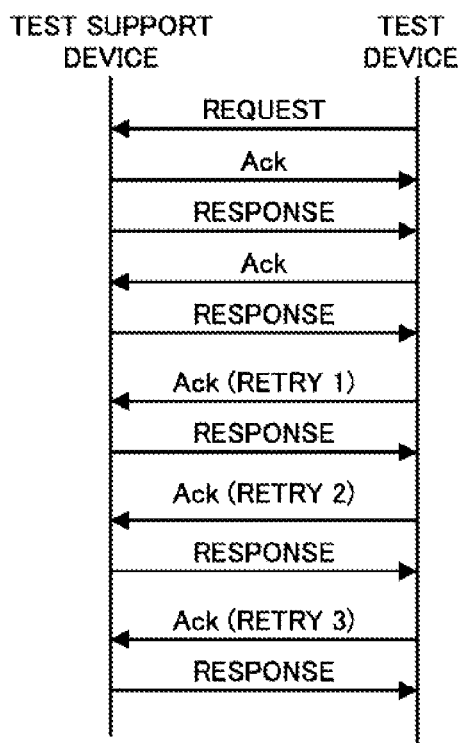
FIG. 24 is a diagram illustrating an example of a script corresponding to the "case of repeatedly receiving a response" in Embodiment 2.
FIG. 25A is a diagram illustrating a normal communication sequence in the "case of repeatedly receiving a response" in Embodiment 2.

As another example, on the test operating screen 2101, if the user inputs "10" as the recipient device address and selects the "case of repeatedly receiving a response" as the test case, the simulation process section 245 generates a script as illustrated in FIG. 24. Herein, the "case of repeatedly receiving a response" refers to a test case of "repeatedly transmitting a response with respect to a control command indicating a request from the test device", or in other words, means a test case in which the test device transmits a control command indicating a request to a recipient, and repeatedly receives a response from that recipient.

Figure 25B:
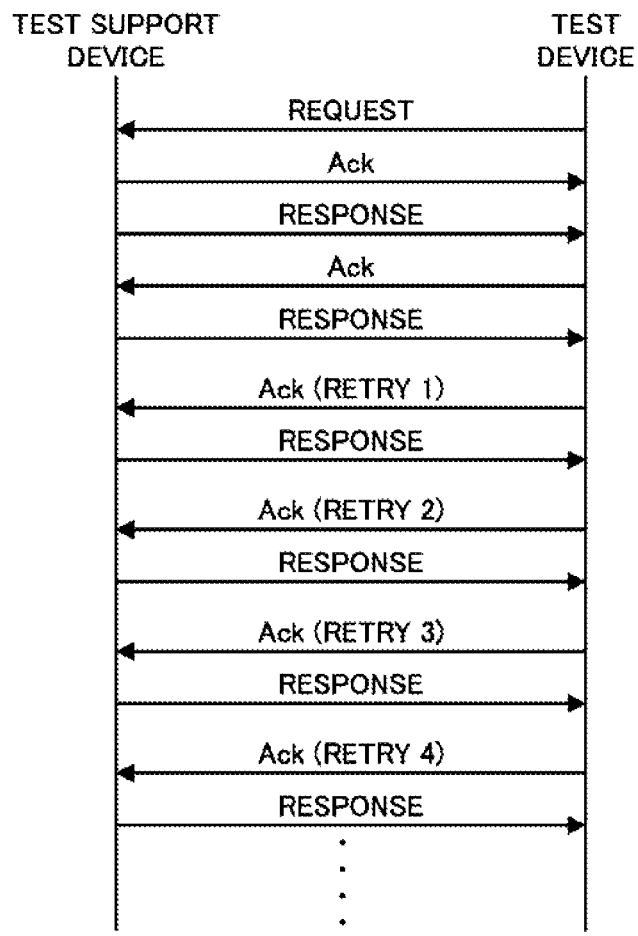
FIG. 25B is a diagram illustrating a (first) example of an abnormal communication sequence in the "case of repeatedly receiving a response" in Embodiment 2.
Figure 25C:
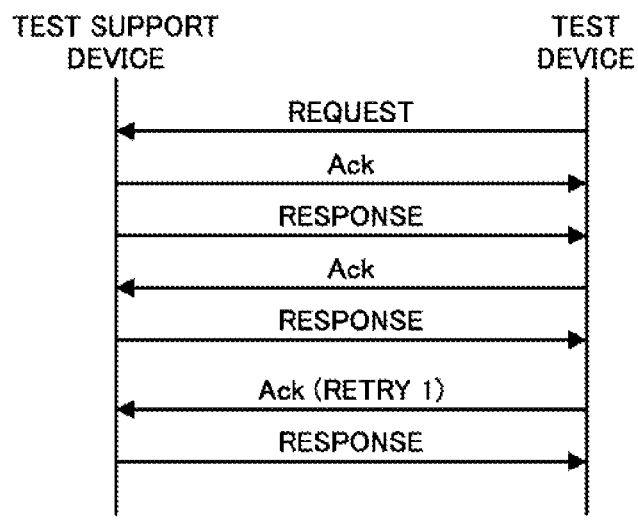
FIG. 25C is a diagram illustrating a (second) example of an abnormal communication sequence in the "case of repeatedly receiving a response" in Embodiment 2.

In this test case, suppose that in the correct communication sequence, an Ack is resent three times from the test device with respect to repeated responses from the test support device 6, as illustrated in FIG. 25A. Consequently, in the case in which an Ack is resent four or more times from the test device as illustrated in FIG. 25B, or resent only one time as illustrated in FIG. 25C, the simulation process section 245 determines that the communication sequence for that test was abnormal.

Next, an example of a communication test of a test device using the air conditioner testing system 1A configured as above will be described. In this test example, suppose that the user assigns "55" as the device address of the test support device 6, and also specifies the test case "the case of not receiving a response" for a testing device with the device address "10". Also, suppose that the test device simulator 2 is simulating the behavior of an indoor device with the device address "10".

First, in the test device simulator 2, the user operates the test operating screen 1001 to display the environmental parameter configuration screen 1101 (see FIG. 11), and on this screen configures the indoor temperature to 25° C. Next, in the air-conditioning system simulator 3, the user operates the test operating screen 1001 corresponding to the outdoor device with the device address "55" to display the test data transmission screen 1201 (see FIG. 12). Subsequently, on this screen, the user makes a configuration instructing the indoor device with the device address "10" to conduct heating operation at 20° C., and pushes the OK button 1205. Consequently, a control command indicating heating operation at 20° C. is transmitted to the test device simulator 2. Note that the user may also perform an operation to transmit the above control command via a test operating screen 1001 that corresponds to a testing device other than the outdoor device with the device address "55".

After the test device simulator 2 receives the control command, the board simulator 2410 recognizes the content of the control command, that is, the instruction for heating operation at 20° C. However, in this case, since the indoor temperature is greater than the set temperature, the board simulator 2410 puts the operation corresponding to the operating instruction in a deferred state without immediately executing.

Next, in the air-conditioning system simulator 3, the user pushes the end button 1006 on the test operating screen 1001 corresponding to the outdoor device with the device address "55", and ends execution of the simulation corresponding to the outdoor device.

Next, in the test device simulator 2, the user operates the test operating screen 1001 and configures the indoor temperature to 15° C. on the environmental parameter configuration screen 1101 (see FIG. 11). Consequently, the sensor simulator 2411 outputs a voltage value corresponding to the indoor temperature "15° C." (for example, 2.2 [V]) as a measurement result to the board simulator 2410. The board simulator 2410 detects that the indoor temperature has become less than the set temperature, generates a control command requesting heating operation at 20° C. for the outdoor device with the device address "55", and writes the generated control command to the transmit buffer corresponding to the control board-side port (for example, the communication port labeled "UART2").

The control command written to the transmit buffer is output onto the air-conditioning network 4 by the command transmitter/receiver 242 and the external inputter/outputter 23 of the test device simulator 2. The control command is received by the test support device 6.

The simulation process section 245 of the test support device 6, following the generated script, exchanges data with the test device (test device simulator 2). Specifically, in this test case, even if a control command is received from the test device simulator 2, only an Ack is transmitted, and a control command indicating a response is not transmitted.

The simulation process section 245 of the test support device 6 determines whether or not the communication sequence was normal from the result of the data exchange with the test device, and reports the determination result to the user I/F process section 244. The user I/F process section 244 presents a popup display of a screen (not illustrated) indicating the determination result by the simulation process section 245 on top of the test operating screen 2101.

In this way, according to the air conditioner testing system 1A of the present embodiment, a simulated, arbitrary communication test with a test device may be executed. Consequently, it becomes easy to conduct an abnormality-related communication test that is difficult to realize with system testing using real devices like in the related art.

(Embodiment 3)

Next, an air conditioner testing system according to Embodiment 3 of the present disclosure will be described. Note that in the following description, structural elements shared in common with the air conditioner testing system 1 of Embodiment 1 and the air conditioner testing system 1A of Embodiment 2 will be denoted with the same signs, and description thereof will be reduced or omitted.

Figure 26:
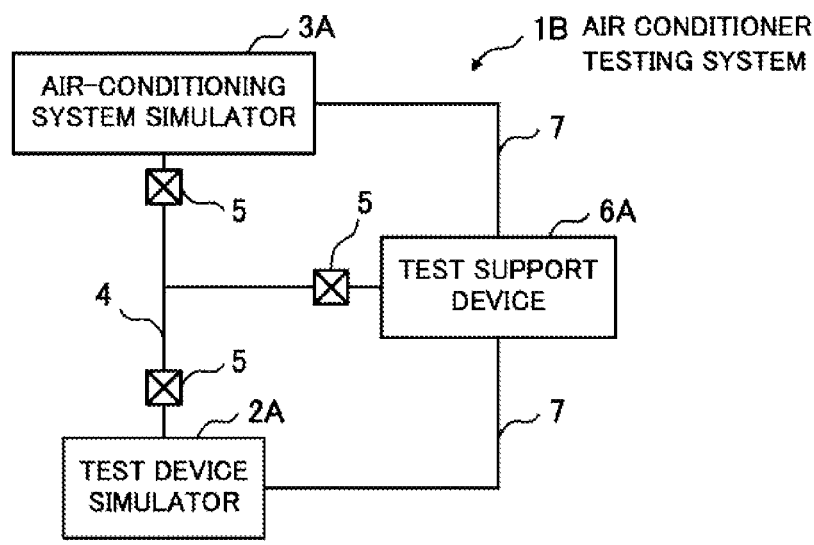
FIG. 26 is a diagram illustrating a configuration of an air conditioner testing system according to Embodiment 3 of the present disclosure.

FIG. 26 is a block diagram illustrating a configuration of an air conditioner testing system 1B of Embodiment 3. Similarly to the air conditioner testing system 1 of Embodiment 1 and the air conditioner testing system 1A of Embodiment 2, this air conditioner testing system 1B is a system for performing simulated operational testing of an air-conditioning system made up of multiple air conditioners (real devices).

The air conditioner testing system 1B comprises a test device simulator 2A, an air-conditioning system simulator 3A, and a test support device 6A. These are connected to an air-conditioning network 4 via respective protocol converters 5, and are also connected to a designated network 7 such as a LAN.

Figure 27:
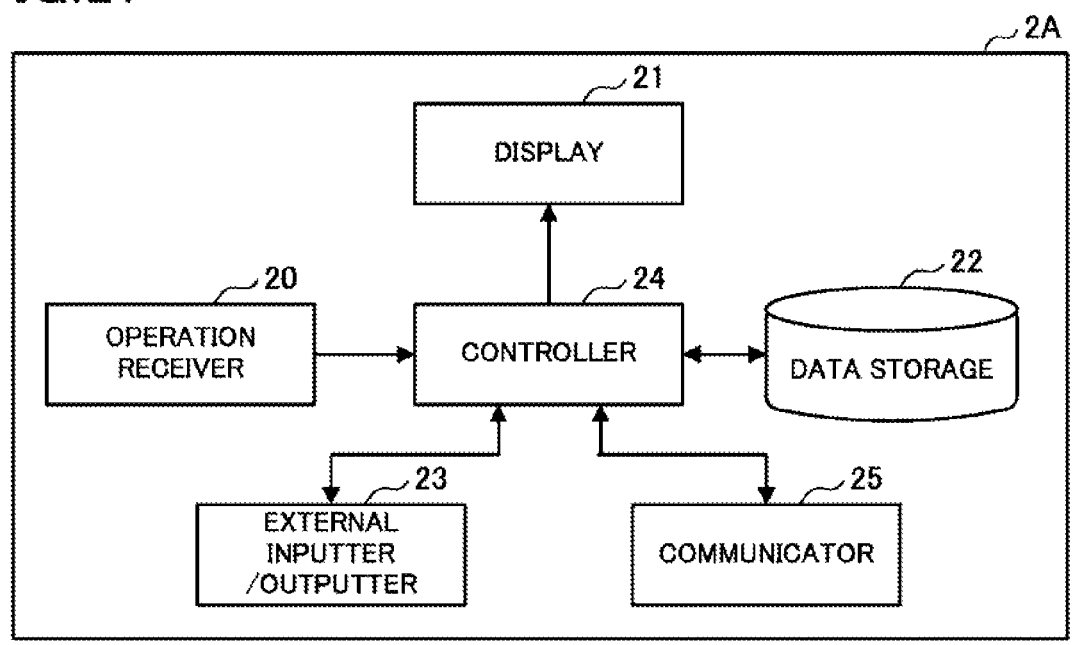
FIG. 27 is a block diagram illustrating a configuration of the test device simulator of Embodiment 3.

The test device simulator 2A is a device for simulating the behavior of a real device to be tested (a test device). As illustrated in FIG. 27, the test device simulator 2A comprises an operation receiver 20, a display 21, data storage 22, an external inputter/outputter 23, a controller 24, and a communicator 25. The communicator 25 includes a communication interface such as a network card, for example, and under control by the controller 24, communicates with the test support device 6A and the like via the network 7 according to a designated communication scheme.

Figure 28:
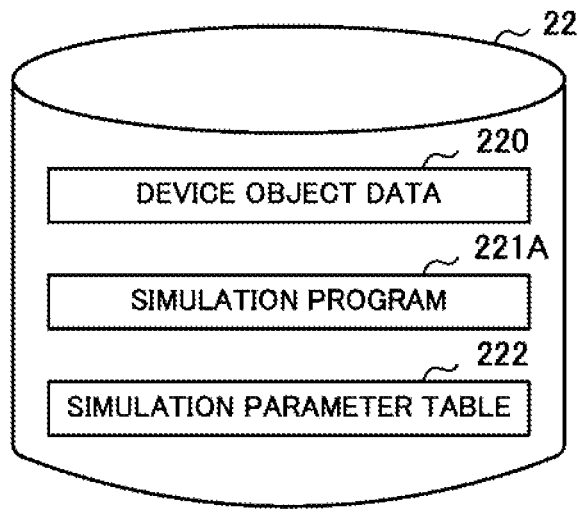
FIG. 28 is a diagram for explaining a data storage provided in the test device simulator of Embodiment 3.

Although various general-purpose programs, various data, and the like are stored in the data storage 22 of the test device simulator 2A, as a configuration characteristic to the embodiment of the present disclosure, device object data 220, a simulation program 221A, and a simulation parameter table 222 are stored, as illustrated in FIG. 28.

The simulation program 221A is a program for simulating the behavior of a test device in the test device simulator 2, and is created in advance for each type of test device.

Figure 29:
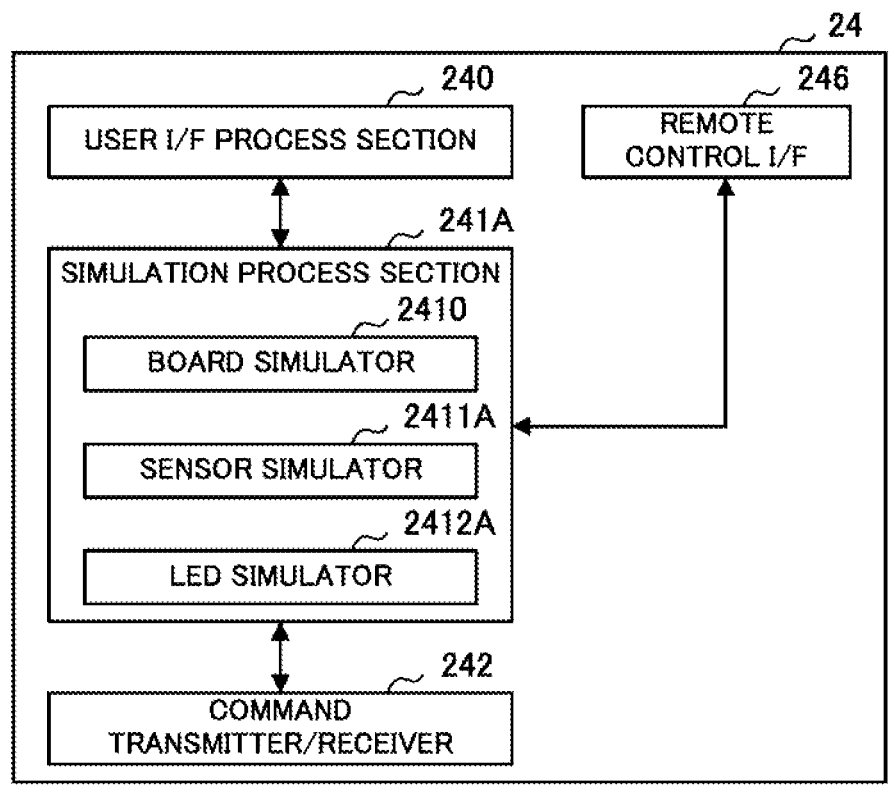
FIG. 29 is a block diagram illustrating a functional configuration of a controller provided in the test device simulator of Embodiment 3.

As a configuration characteristic to the embodiment of the present disclosure, the controller 24 functionally comprises a user I/F process section 240, a simulation process section 241A, a command transmitter/receiver 242, and a remote control OF 246, as illustrated in FIG. 29. The functionality of each of these functional components is realized by the CPU executing the above simulation program 221A stored in the data storage 22.

The simulation process section 241A conducts a process of simulating the behavior of the test device. More specifically, as illustrated in FIG. 29, the simulation process section 241A comprises a board simulator 2410, a sensor simulator 2411A, and an LED simulator 2412A.

The sensor simulator 2411A has nearly the same functionality as the sensor simulator 2411 of Embodiments 1 and 2. However, the sensor simulator 2411A also outputs a measurement result (for example, a voltage value) of an environmental parameter (for example, an indoor temperature) remotely configured by the test support device 6A.

The LED simulator 2412A has nearly the same functionality as the LED simulator 2412 of Embodiments 1 and 2. However, the LED simulator 2412A issues a notification with an instruction to turn on or turn off the LED to not only the user I/F process section 240, but also to the remote control OF 246 to be discussed later.

The remote control OF 246, upon receiving environmental parameter configuration information from the test support device 6A via the communicator 25, extracts and supplies the configuration content (for example, an indoor temperature) from the environmental parameter configuration information to the sensor simulator 2411A. Also, the remote control OF 246, upon receiving a notification with an instruction to turn on or turn off the LED from the LED simulator 2412A, generates LED state information including the instruction content and the device address of the test device, and transmits the generated LED state information to the test support device 6A via the communicator 25.

Functions of the simulation process section 241A other than the above are similar to the simulation process section 241 of Embodiments 1 and 2.

Next, the air-conditioning system simulator 3A will be described. The air-conditioning system simulator 3A is a device for simulating the behavior of multiple other air conditioners (testing devices) in an air-conditioning system to which the test device belongs.

The air-conditioning system simulator 3A comprises a configuration similar to the test device simulator 2A. In other words, as illustrated in FIG. 29, the air-conditioning system simulator 3A comprises an operation receiver 20, a display 21, a data storage 22, an external inputter/outputter 23, a controller 24, and a communicator 25.

Figure 30:
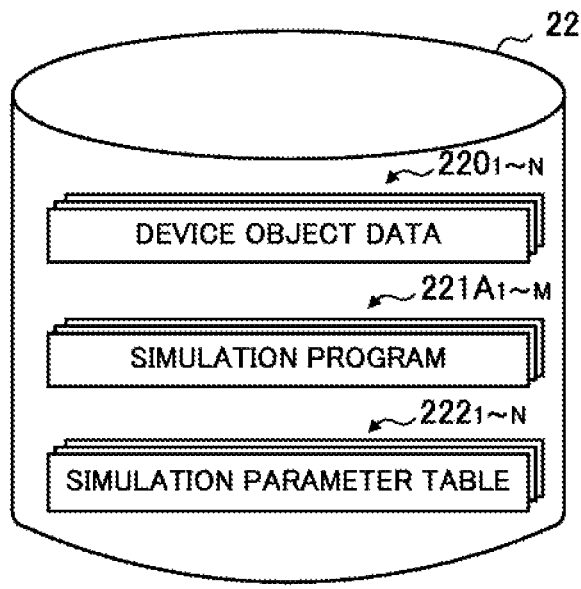
FIG. 30 is a diagram for explaining a data storage provided in the air-conditioning system simulator of Embodiment 3.

As illustrated in FIG. 30, the data storage 22 of the air-conditioning system simulator 3A, unlike the case of the test device simulator 2A, stores multiple device object data $220_{1-N}$, multiple simulation programs $221A_{1-M}$, and multiple simulation parameter tables $222_{1-N}$.

Each of the device object data $220_{1-N}$ corresponds to a respective testing device to simulate. Also, each of the simulation parameter tables $222_{1 \sim N}$ stores parameters for simulating a respective testing device. In the present embodiment, N testing devices (where N is an integer equal to or greater than 2) are simulated.

Each of the simulation programs $221A_{1 \sim M}$ is created in advance for each type of testing device to simulate. In the present embodiment, the total number of types of testing device to simulate is M (where M is an integer equal to or greater than 2)

In the air-conditioning system simulator 3A, when the user starts execution of the simulation of a respective testing device, the simulation program 221A corresponding to the type of that testing device is selected and activated from among the simulation programs $221A_{1 \sim M}$. Additionally, similarly to the case of the test device simulator 2A, the user configures initial parameters (preconditions) for simulating that testing device via the simulation parameter configuration screen 501. The user conducts such operations for all testing devices to be simulated.

Figure 31:
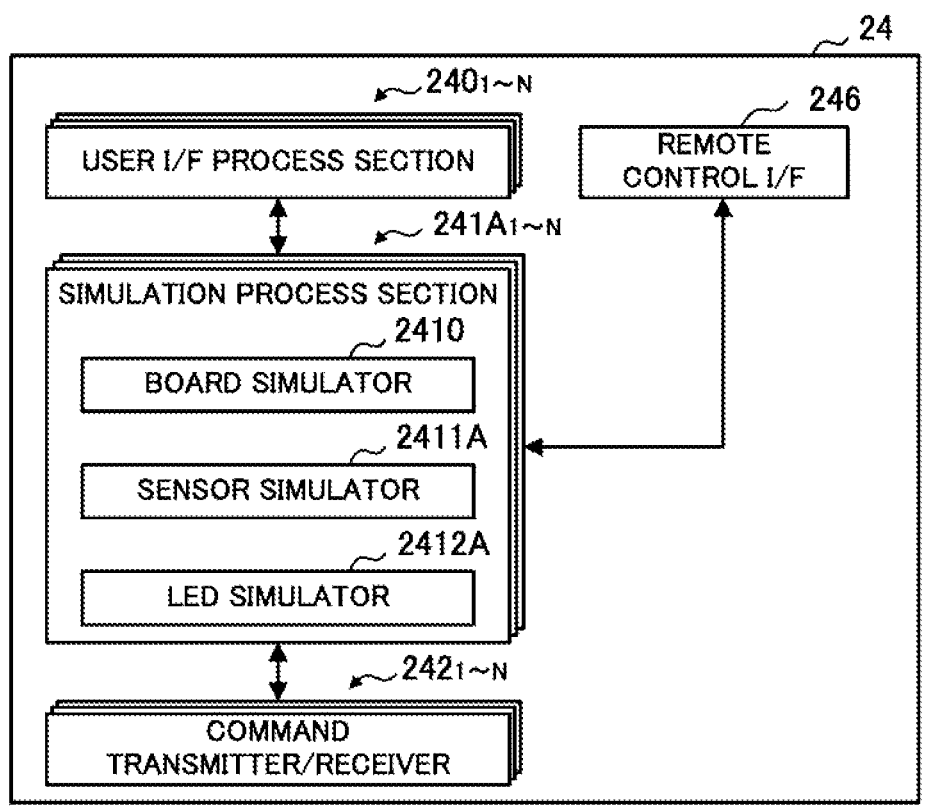
FIG. 31 is a block diagram illustrating a functional configuration of a controller provided in the air-conditioning system simulator of Embodiment 3.

After the user conducts the above operations, the functional configuration of the controller 24 of the air-conditioning system simulator 3A becomes like that illustrated in FIG. 31. In this way, after the configuration of initial parameters is complete for all testing devices to be simulated, the controller 24 of the air-conditioning system simulator 3A is functionally configured with multiple user I/F process sections $240_{1 \sim N}$, multiple simulation process sections $241A_{1 \sim N}$, multiple command transmitters/receivers $242_{1 \sim N}$, and the remote control I/F 246.

In other words, each user I/F process section 240, each simulation process section 241A, and each command transmitter/receiver 242 executes a process that simulates the behavior of one testing device. In this case, N test operating screens 1001 (see FIG. 10) corresponding to each testing device are displayed on the display 21.

In the air-conditioning system simulator 3A, each process due to a user operation via each test operating screen 1001 is similar to the case of the test device simulator 2A.

Next, the test support device 6A will be described. The test support device 6A is a device for supporting operational testing of a test device. The test support device 6A comprises a similar configuration as the test device simulator 2A and the air-conditioning system simulator 3A. In other words, as illustrated in FIG. 27, the test support device 6A comprises an operation receiver 20, a display 21, a data storage 22, an external inputter/outputter 23, a controller 24, and a communicator 25.

Figure 32:
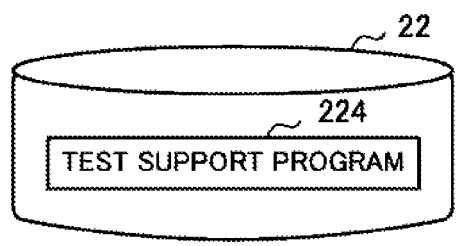
FIG. 32 is a diagram for explaining a data storage provided in the test support device of Embodiment 3.

Although various general-purpose programs, various data, and the like are stored in the data storage 22 of the test support device 6A, as a configuration characteristic to the embodiment of the present disclosure, a test support program 224 is stored, as illustrated in FIG. 32. The test support program 224 is a program for supporting operational testing of a test device.

Figure 33:
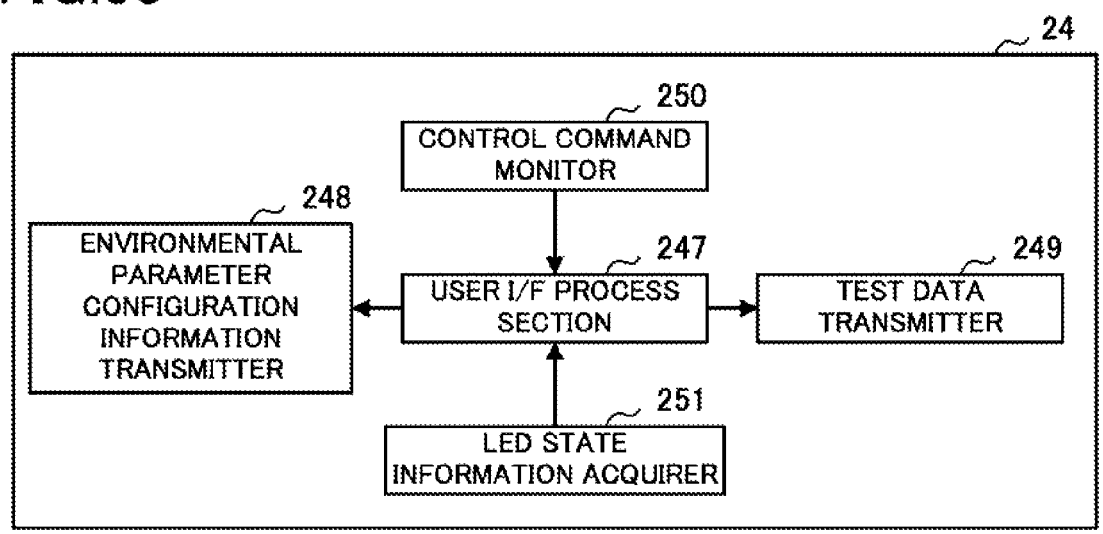
FIG. 33 is a block diagram illustrating a functional configuration of a controller provided in the test support device of Embodiment 3.

As a configuration characteristic to the embodiment of the present disclosure, as illustrated in FIG. 33, the controller 24 of the test support device 6A functionally comprises a user I/F process section 247, an environmental parameter configuration information transmitter 248, a test data transmitter 249, a control command monitor 250, and an LED state information acquirer 251. The functionality of each of these functional components is realized by the CPU executing the above test support program 224 stored in the data storage 22.

Figure 34:
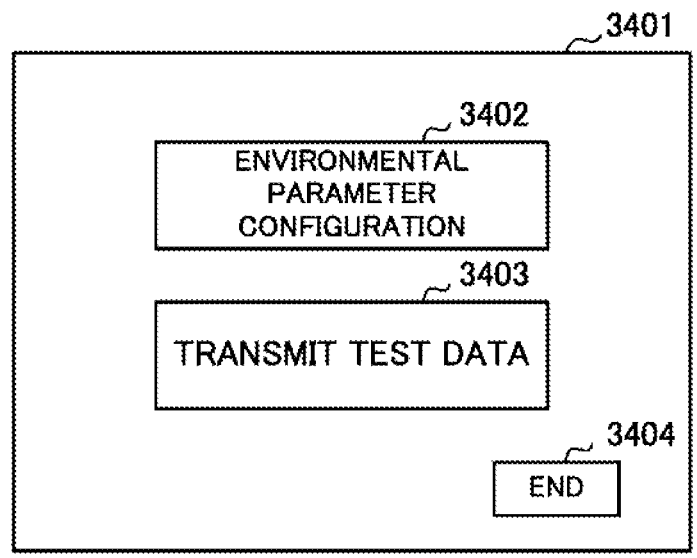
FIG. 34 is a diagram illustrating an example of a test operating screen of Embodiment 3.

If the user performs a designated operation for activating the above test support program 224 via the operation receiver 20, the user I/F process section 247 displays, via the display 21, a test operating screen 3401 as illustrated in FIG. 34. As illustrated in FIG. 34, the test operating screen 3401 includes an environmental parameter configuration button 3402, a test data transmit button 3403, an end button 3404, and the like.

The environmental parameter configuration button 3402 is a button used to receive from the user the configuration of a measured value in a sensor of the test device or a testing device. The test data transmit button 3403 is a button used to receive from the user the configuration of the content of data for testing to transmit to the test device or a testing device, and to transmit the data.

The end button 3404 is a button used to end execution of the test support program 224 by the CPU.

Figure 35:
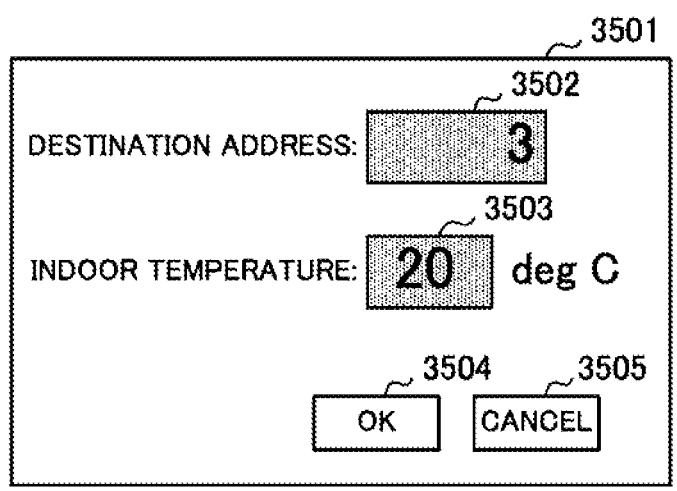
FIG. 35 is a diagram illustrating an example of an environmental parameter configuration screen of Embodiment 3.

If the user pushes the environmental parameter configuration button 3402, the user I/F process section 247 presents a popup display of the environmental parameter configuration screen 3501 illustrated in FIG. 35 on top of the test operating screen 3401. The environmental parameter configuration screen 3501 is a screen enabling the user to configure an indoor temperature measured by a sensor respectively provided in the test device and testing device.

As illustrated in FIG. 35, the environmental parameter configuration screen 3501 includes a destination address input field 3502, an indoor temperature input field 3503, an OK button 3504, a cancel button 3505, and the like. The destination address input field 3502 is a text box for inputting a device address of a real device to be remotely configured with an indoor temperature. The indoor temperature input field 3503 is a text box for inputting an indoor temperature.

If the user inputs a device address and an indoor temperature, and pushes the OK button 3504, the user I/F process section 247 acquires and supplies the device address and indoor temperature input by the user to the environmental parameter configuration information transmitter 248. The environmental parameter configuration information transmitter 248 generates the environmental parameter configuration information discussed earlier, on the basis of a device address and an indoor temperature supplied from the user I/F process section 247. Subsequently, the environmental parameter configuration information transmitter 248 sends the generated environmental parameter configuration information on the network 7 via the communicator 25. The environmental parameter configuration information is received by the remote control I/F 246 of the test device simulator 2A or the air-conditioning system simulator 3A. From the received environmental parameter configuration information, the remote control I/F 246 extracts a device address and configuration content (for example, an indoor temperature), and supplies the extracted configuration content to the sensor simulator 2411A of the simulation process section 241A corresponding to the extracted device address.

On the other hand, if the cancel button 3505 is pushed, the user I/F process section 247 closes the environmental parameter configuration screen 3501 without acquiring a destination address and an indoor temperature input by the user.

If the user pushes the test data transmit button 3403 on the test operating screen 3401, the user I/F process section 247 presents a popup display of the test data configuration screen 1201 illustrated in FIG. 12 on top of the test operating screen 3401. The screen layout of the test data configuration screen 1201 is as discussed earlier. On the test data configuration screen 1201, if the user configures the content of test data (a control command) and pushes the OK button 1205, the user I/F process section 247 reports the content of the test data configured by the user to the test data transmitter 249.

The test data transmitter 249 generates a control command on the basis of the reported test data content. The format of the control command generated at this point is the same as the format of a control command used in an actual air-conditioning system. The test data transmitter 249 writes the generated control command to the transmit buffer of a port connected to the air-conditioning network 4 via a protocol converter 5 (for example, the USB port corresponding to "USB1").

The external inputter/outputter 23 outputs a control command written to this transmit buffer of the above port used by the external inputter/outputter 23 itself onto the air-conditioning network 4 via the protocol converter 5. Consequently, such a control command is received by the test device simulator 2A or the air-conditioning system simulator 3A, and supplied to the corresponding board simulator 2410.

The control command monitor 250 monitors control commands flowing on the air-conditioning network 4 via the external inputter/outputter 23, and supplies a monitored control command to the user I/F process section 247. The user I/F process section 247 displays the content of a control command supplied from the control command monitor 250 in a designated format via the display 21.

The LED state information acquirer 251 receives LED state information transmitted from the remote control I/F 246 of the test device simulator 2A or the air-conditioning system simulator 3A via the communicator 25. The LED state information acquirer 251 supplies received LED state information to the user I/F process section 247. The user I/F process section 247 displays the content of the LED state information supplied from the LED state information acquirer 251 in a designated format via the display 21.

Next, an example of an operational test of a test device using the air conditioner testing system 1B configured as above will be described. In this test example, in the case of instructing a specific testing device (an indoor device with the device address "3") to conduct heating operation, the user checks that a test device (an outdoor device with the device address "55") starts operating when the indoor temperature is less than the set temperature. Note that as a prerequisite to conducting this test, assume that in the test device simulator 2A, the configuration of initial parameters for simulating the test device is complete, and the test operating screen 1001 is being displayed. Similarly, assume that in the air-conditioning system simulator 3A, the configuration of initial parameters for simulating each testing device is complete, and a number of corresponding test operating screens 1001 equal to the number of testing devices are being displayed.

Under the above conditions, first, in the test support device 6A, the user pushes the environmental parameter configuration button 3402 on the test operating screen 3401 (see FIG. 34) to display the environmental parameter configuration screen 3501 (see FIG. 35), and on this screen, configures "3" as the destination address, and also configures the indoor temperature to 25° C.

Consequently, the sensor simulator 2411A corresponding to the device address "3" in the air-conditioning system simulator 3A outputs a voltage value corresponding to the indoor temperature "25° C." (for example, 1.6 [V]) as a measurement result to the board simulator 2410 corresponding to the device address "3".

Next, the user pushes the test data transmit button 3403 on the test operating screen 3401 to display the test data configuration screen 1201 (see FIG. 12). Subsequently, on this screen, the user makes a configuration instructing the indoor device with the device address "3" to conduct heating operation at 20° C., and pushes the OK button 1205. Thus, as discussed earlier, the test data transmitter 249 generates a control command corresponding to the configured operating instruction content, and the generated control command is output onto the air-conditioning network 4 via the protocol converter 5 by the external inputter/outputter 23 of the test support device 6A.

The air-conditioning system simulator 3A receives the control command, and the board simulator 2410 corresponding to the device address "3" recognizes the content of the control command, that is, the instruction for heating operation at 20° C. However, in this case, since the indoor temperature is greater than the set temperature, the board simulator 2410 puts the operation corresponding to the operating instruction in a deferred state without immediately executing.

Next, in the test support device 6A, the user operates the test operating screen 3401 to once again display the environmental parameter configuration screen 3501, and on this screen, configures "3" as the destination address, and also configures the indoor temperature to 15° C.

Consequently, the sensor simulator 2411A corresponding to the device address "3" in the air-conditioning system simulator 3A outputs a voltage value corresponding to the indoor temperature "15° C." (for example, 2.2 [V]) as a measurement result to the board simulator 2410 corresponding to the device address "3".

The board simulator 2410 corresponding to the device address "3" detects that the indoor temperature has become less than the set temperature, generates a control command requesting heating operation at 20° C. for the outdoor device with the device address "55" (that is, the test device), and as discussed earlier, writes the generated control command to the transmit buffer corresponding to the control board-side port (for example, the communication port labeled "UART2").

The control command written to the transmit buffer is output onto the air-conditioning network 4 by the command transmitter/receiver 242 corresponding to the device address "3", and by the external inputter/outputter 23. The control command is received by the test device simulator 2A, and also monitored by the control command monitor 250 of the test support device 6A.

The control command received by the test device simulator 2A is analyzed by the board simulator 2410, and the request for heating operation at 20° C. is recognized. Subsequently, the board simulator 2410 of the test device simulator 2A executes a process related to heating operation in accordance with the request. In order to notify the user that heating operation behavior is being conducted, the board simulator 2410 writes ON instruction information (for example, "High") to a register corresponding to I/O predetermined according to the specifications of the control board (for example, the I/O port labeled "P3").

After the ON instruction information is written to the above register, the LED simulator 2412A issues a notification instructing the remote control I/F 246 to turn on the LED. The remote control I/F 246, upon receiving the notification from the LED simulator 2412A, generates LED state information including the instruction to turn on the LED and the device address of the test device (herein, "55"), and transmits the generated LED state information to the test support device 6A via the communicator 25.

The LED state information acquirer 251 of the test support device 6A receives the LED state information transmitted from the remote control I/F 246 of the test device simulator 2A via the communicator 25. The LED state information acquirer 251 supplies the received LED state information to the user I/F process section 247. The user I/F process section 247, following the content of the LED state information supplied from the LED state information acquirer 251, displays the state of the LED of the test device (herein, that the LED is turned on).

As discussed above, according to an air conditioner testing system 1B of the present embodiment, a test support device 6A may remotely configure an environmental parameter such as an indoor temperature corresponding to a real device simulated by a test device simulator 2A or an air-conditioning system simulator 3A. In addition, the test support device 6A may configure and transmit test data, and also check whether or not an LED in each real device is turned on. In this way, since it is possible to remotely configure an environmental parameter, execute a test, check the result, and the like via the test support device 6A, convenience and workability during testing is potentially improved further.

Note that the present disclosure is not limited to the foregoing exemplary embodiments, and that various modifications are obviously possible within a scope that does not depart from the spirit of the present disclosure.

For example, by applying the programs respectively executed by the test device simulator 2 or 2A, the air-conditioning system simulator 3 or 3A, and the test support device 6 or 6A of the foregoing embodiments to an existing personal computer (PC) or the like, it is possible to make the PC function as the test device simulator 2 or 2A, the air-conditioning system simulator 3 or 3A, and the test support device 6 or 6A of the foregoing embodiments.

The method of distributing such programs is arbitrary, and the programs may be stored and distributed on a non-transitory computer-readable recording medium such as a flexible disk, a Compact Disc Read-Only Memory (CD-ROM), a Digital Versatile Disc (DVD), a Magneto-Optical (MO) disc, or a memory card. Alternatively, the above programs may be stored in a disk device or the like included in a server device on a communication network such as the Internet, and delivered from the server device via the communication network by being modulated onto a carrier wave.

In this case, in cases such as where functions related to the present disclosure discussed above are realized under the assignment of an operating system (OS) and an application program, or by cooperative action between an OS and the application program, only the application program portion may be stored on the non-transitory recording medium or the like.

Various embodiments and alterations of the present disclosure are possible without departing from the scope and spirit of the present disclosure in the broad sense. Furthermore, the foregoing embodiments are for the purpose of describing the present disclosure, and do not limit the scope of the present disclosure. In other words, the scope of the present disclosure is indicated by the claims rather than the embodiments. In addition, various alterations performed within the scope of the claims or within an equivalent scope of the significance of the present disclosure are to be regarded as being within the scope of the present disclosure.

INDUSTRIAL APPLICABILITY

The present disclosure may be suitably applied to the testing of an air-conditioning system made up of many air conditioners.

REFERENCE SIGNS LIST 1, 1A, 1B air conditioner testing system
2, 2A test device simulator
3, 3A air-conditioning system simulator
4 air-conditioning network
5 protocol converter
6, 6A test support device
7 network
20 operation receiver
21 display
22 data storage
23 external inputter/outputter
24 controller
25 communicator
220 device object data
221, 221A, 223 simulation program
222 simulation parameter table
240, 244, 247 user I/F process section
241, 241A, 245 simulation process section
242 command transmitter/receiver
243 test data transmitter
246 remote control I/F
248 environmental parameter configuration information transmitter
249 test data transmitter
250 control command monitor
251 LED state information acquirer
2410 board simulator
2411, 2411A sensor simulator
2412, 2412A LED simulator

The invention claimed is:
1. An air conditioner testing system comprising:
a test device simulator that simulates behavior of a test device to be tested, the test device being an air conditioner among a plurality of air conditioners that constitute an air-conditioning system, the plurality of air conditioners includes the test device to be tested and other air conditioners; and
an air-conditioning system simulator that simulates behavior of the other air conditioners among the plurality of air conditioners;
wherein the test device simulator includes
a first controller,
a first operation receiver that receives a first input operation from a user, and sends to the first controller a signal related to the received first input operation,
a first data storage that stores device object data that is the same as device object data loaded in the test device, and
a first communicator that, under control by the first controller, performs data communication with the air-conditioning system simulator via a first network,
the first controller includes
a CPU that executes a first simulation program stored in the first data storage to provide,
a first simulation process section that simulates behavior of the test device based on content indicated by the first input operation from the user, data transmitted from the air-conditioning system simulator, and the device object data stored in the first data storage, and
a first data transmitter/receiver that supplies data transmitted from the air-conditioning system simulator to the first simulation process section, and in addition, in a case in which the first simulation process section generates data to transmit to the air-conditioning system simulator, supplies the data to the first communicator, the air-conditioning system simulator includes
a second controller,
a second operation receiver that receives a second input operation from the user, and sends to the second controller a signal related to the received second input operation,
a second data storage that stores device object data that is the same as device object data loaded in each of the other air conditioners, and
a second communicator that, under control by the second controller, performs data communication with the test device simulator via the first network,
the second controller includes a CPU that executes a second simulation program stored in the second data storage to provide second simulation process sections and second data transmitters/receivers,
each second simulation process section
corresponds to one air conditioner among the other air conditioners, and
simulates behavior of the one air conditioner to which the second simulation process section corresponds, based on content indicated by the second input operation, data that is transmitted from the test device simulator to the one air conditioner to which the second simulation process section corresponds, and the device object data that is stored in the second data storage and corresponds to the one air conditioner to which the second simulation process section corresponds, and
each second data transmitter/receiver
corresponds to one air conditioner among the other air conditioners, and
supplies data that is transmitted from the test device simulator to the one air conditioner to which the second data transmitter/receiver corresponds, to a corresponding second simulation process section, and in addition, in a case in which the corresponding second simulation process section generates data to transmit to the test device simulator, supplies the data to the second communicator.

2. The air conditioner testing system according to claim 1, wherein
the first simulation process section includes
a first board simulator that simulates behavior of a control board provided in the test device, and
a first peripheral device simulator that simulates behavior of a designated peripheral device connected to the control board, and
each second simulation process section includes
a second board simulator that simulates behavior of a control board provided in the one air conditioner to which the second simulation process section corresponds, and
a second peripheral device simulator that simulates behavior of a designated peripheral device connected to the control board.

3. The air conditioner testing system according to claim 2, wherein
the first board simulator, in the case of information input/output, uses a register or buffer pre-associated with a port according to the specifications of the control board provided in the test device, and
the second board simulator, in the case of information input/output, uses a register or buffer pre-associated with a port according to the specifications of the control board provided in the one air conditioner to which the second simulation process section corresponds.

4. The air conditioner testing system according to claim 2, wherein
the first peripheral device simulator provided in the first simulation process section simulates behavior of a sensor that detects a designated environmental parameter, and
the second peripheral device simulator provided in each second simulation process section simulates behavior of a sensor that detects the environmental parameter.

5. The air conditioner testing system according to claim 4, wherein
the first controller additionally includes a first environmental parameter configuration receiver that receives a configuration of the environmental parameter by the user, and
the second controller additionally includes, for each of the other air conditioners, a second environmental parameter configuration receiver that receives a configuration of the environmental parameter by the user.

6. The air conditioner testing system according to claim 1, further comprising:
a test support device;
wherein the test support device includes
a third controller,
a third operation receiver that receives a third input operation from the user, and sends to the third controller a signal related to the received third input operation, and
a third communicator that, under control by the third controller, performs data communication with the test device simulator via the first network, and
the third controller decides content of a communication test of communication with the test device on the basis of content indicating the third input operation by the user, and on the basis of the decided content of the communication test, performs data communication with the test device simulator via the third communicator.

7. The air conditioner testing system according to claim 4, further comprising:
a test support device;
wherein the test support device includes
a fourth controller,
a fourth operation receiver that receives a fourth input operation from the user, and sends to the fourth controller a signal related to the received fourth input operation, and
a fourth communicator that, under control by the fourth controller, performs data communication with the test device simulator and the air-conditioning system simulator via a second network, and
the fourth controller receives a configuration of the environmental parameter for a specified air conditioner of the plurality of air conditioners, the specified air conditioner being specified by the user from among the plurality of air conditioners that constitute the air-conditioning system, and sends on the second network an environmental parameter configuration information that includes information identifying the specified air conditioner, and the configured environmental parameter.

8. An air-conditioning system simulator comprising:
a controller;

an operation receiver that receives an input operation from a user, and sends to the controller a signal related to the received operation;

a data storage that stores device object data that is the same as device object data loaded in each of a plurality of air conditioners that constitute an air-conditioning system; and a communicator that, under control by the controller, performs data communication with a test device simulator via a designated network;

wherein the controller includes a CPU that executes a simulation program stored in the data storage to provide simulation process sections and data transmitters/receivers, each simulation process section
- corresponds to one air conditioner among the plurality of air conditioners that constitute the air-conditioning system, and
- simulates behavior of the one air conditioner to which the simulation process section corresponds, based on content indicated by the input operation, data that is transmitted from the test device simulator to the one air conditioner to which the simulation process section corresponds, and the device object data that is stored in the data storage and corresponds to the one air conditioner to which the simulation process section corresponds, and each data transmitter/receiver
- corresponds to one air conditioner among the plurality of air conditioners, and
- supplies data that is transmitted from the test device simulator to the one air conditioner to which the data transmitter/receiver corresponds, to a corresponding simulation process section, and in a case in which the corresponding simulation process section generates data to transmit to the test device simulator, supplies the data to the communicator.

9. A non-transitory computer-readable recording medium storing a simulation program for execution by a computer comprising:

a controller;

an operation receiver that receives an input operation from a user, and sends to the controller a signal related to the received operation;

a data storage that stores device object data that is the same as device object data loaded in an air conditioner of a plurality of air conditioners constituting an air-conditioning system, the simulation program for simulating behavior of the air conditioner, and a simulation parameter table for storing parameters for simulating the air conditioner; and a communicator that, under control by the controller, performs data communication with an air-conditioning system simulator via a designated network, wherein the controller comprises:
a CPU that executes the simulation program to provide:
- a simulation process section that
  - comprises a board simulator, a sensor simulator, and an LED simulator, and
  - simulates, based on content indicated by the input operation, data transmitted from the air-conditioning system simulator, and the device object data stored in the data storage, behavior of a control board included in the air conditioner, behavior of a sensor included in the air conditioner, and behavior of an LED included in the air conditioner; and
- a data transmitter/receiver that supplies data transmitted from the air-conditioning system simulator to the simulation process section, and, in a case in which the simulation process section generates data to transmit to the air-conditioning system simulator, supplies the data to the communicator.

* * * * *